(12) United States Patent
Hidaka

(10) Patent No.: US 9,594,316 B2
(45) Date of Patent: *Mar. 14, 2017

(54) SURFACE POSITIONING DETECTING APPARATUS, EXPOSURE APPARATUS AND DEVICE MANUFACTURING METHOD

(71) Applicant: NIKON CORPORATION, Tokyo (JP)

(72) Inventor: Yasuhiro Hidaka, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/848,463

(22) Filed: Mar. 21, 2013

(65) Prior Publication Data

US 2013/0242304 A1    Sep. 19, 2013

Related U.S. Application Data

(63) Continuation of application No. 12/093,713, filed as application No. PCT/JP2006/322595 on Nov. 14, 2006, now Pat. No. 8,432,554.

(30) Foreign Application Priority Data

Nov. 15, 2005   (JP) ................................. 2005-329645
Nov. 1, 2006    (JP) ................................. 2006-297486

(51) Int. Cl.
| | | |
|---|---|---|
| *G03F 9/02* | (2006.01) | |
| *G03F 9/00* | (2006.01) | |
| *G01B 11/14* | (2006.01) | |

(52) U.S. Cl.
CPC ............ *G03F 9/7065* (2013.01); *G01B 11/14* (2013.01); *G03F 9/7026* (2013.01); *G03F 9/7034* (2013.01); *G03F 9/7088* (2013.01)

(58) Field of Classification Search
CPC ..................... G01B 11/14; G03F 9/00–9/7096
(Continued)

(56) References Cited

U.S. PATENT DOCUMENTS 5,191,200 A    3/1993  Van der Werf et al.
5,602,399 A    2/1997  Mizutani
(Continued)

FOREIGN PATENT DOCUMENTS

CN        1517798        8/2004
EP        1 439 428 A2    7/2004
(Continued)

OTHER PUBLICATIONS

Feb. 26, 2013 Office Action issued in Korean Patent Application No. 10-2008-7007783 (with translation).
(Continued)

*Primary Examiner* — Michael P Lapage
(74) *Attorney, Agent, or Firm* — Oliff PLC

(57) ABSTRACT

A surface position detecting apparatus includes a light projection system that projects a beam from an oblique direction onto a detection target surface, and a light reception system that receives a beam reflected on the detection target surface, said surface position detecting apparatus adapted to detect a surface position of the detection target surface based on an output from the light reception system. At least one of the light projection system and the light reception system includes a total reflection prism member including an internal reflection surface which totally reflects an incident beam. Upon detection of the surface position of the detection target surface, a refractive index of an optical material forming the total reflection prism member and an angle of incidence of the incident beam to the internal reflection surface of the total reflection prism member are set so as to satisfy a predetermined relation.

20 Claims, 25 Drawing Sheets

(58) Field of Classification Search
USPC .................................................. 356/369, 614
See application file for complete search history.

(56) References Cited

U.S. PATENT DOCUMENTS

| | | | |
|---|---|---|---|
| 5,633,721 | A | 5/1997 | Mizutani |
| 6,172,749 | B1 | 1/2001 | Watanabe |
| 6,470,109 | B1 | 10/2002 | Troll |
| 6,897,462 | B2 | 5/2005 | Kawaguchi |
| 7,593,095 | B2 | 9/2009 | Fiolka et al. |
| 2002/0000520 | A1 | 1/2002 | Kawaguchi |
| 2004/0165169 | A1 | 8/2004 | Teunissen et al. |

FOREIGN PATENT DOCUMENTS

| | | |
|---|---|---|
| JP | 06-097045 | 4/1994 |
| JP | 2006-097045 | 4/1994 |
| JP | A-07-162065 | 6/1995 |
| JP | A-07-168011 | 7/1995 |
| JP | A-08-062501 | 3/1996 |
| JP | A-H8-86743 | 4/1996 |
| JP | 2001-296105 | 10/2001 |
| JP | 2004-343045 | 12/2004 |
| WO | WO 2005/083511 | 9/2005 |

OTHER PUBLICATIONS

Jan. 14, 2013 Office Action issued in Taiwan Application No. 095141268 (with translation).
Nov. 12, 2012 Office Action issued in Japanese Patent Application No. P2006-297486 (with translation).
Nov. 13, 2012 Office Action issued in Japanese Patent Application No. P2006-297486 (with translation).
Aug. 29, 2011 Office Action issued in Chinese Application No. 200680042262.8 (with translation).
Communication Pursuant to Article 94(3) EPC issued by European Patent Office on Nov. 17, 2011 in corresponding Application No. EP 06 823 369.1 (6 pages).
Office Action issued Aug. 29, 2011 by China Patent Office in corresponding Application No. 200580042262.8 (14 pages).
European Search Report dated Sep. 17, 2009 (with translation).
Chinese Office Action for Application No. j200680042262 issued on Jan. 22, 2010 (with translation).
Patent Cooperation Treaty—Written Opinion of the International Searching Authority for PCT/JP2006/322595 dated Feb. 27, 2007 (with translation).
Dec. 13, 2011 Office Action in U.S. Appl. No. 12/093,713.
Jul. 5, 2011 Office Action issued in U.S. Appl. No. 12/093,713.
Jun. 4, 2012 Office Action in U.S. Appl. No. 12/093,713.
Dec. 19, 2012 Notice of Allowance in U.S. Appl. No. 12/093,713.
Nov. 11, 2013 Office Action issued in Japanese Patent Application No. 2006-297486 (with translation).
Nov. 11, 2013 Office Action issued in Japanese Patent Application No. 2013-003357 (with translation).
Jun. 30, 2014 Office Action issued in Chinese Patent Application No. 201210150196.3 (with translation).
Feb. 10, 2015 Summons to Attend Oral Proceedings issued in European Application No. 06823369.1.
Feb. 11, 2015 Office Action issued in Chinese Application No. 201210150196.3.
Jun. 22, 2015 Office Action issued in European Application No. 12151076.2.

SURFACE POSITIONING DETECTING APPARATUS, EXPOSURE APPARATUS AND DEVICE MANUFACTURING METHOD This is a Continuation of application Ser. No. 12/093,713 filed May 14, 2008, which in turn is a National Phase of Application No. PCT/JP2006/322595 filed Nov. 14, 2006, which claims priority to Japanese Patent Application No. 2005-329645 filed Nov. 15, 2005 and Japanese Patent Application No. 2006-297486 filed Nov. 1, 2006. The disclosure of the prior applications is hereby incorporated by reference herein in its entirety.

TECHNICAL FIELD

The present invention relates to surface position detecting apparatus, exposure apparatus, and device manufacturing methods. More particularly, the present invention relates to detection of a surface position of a photosensitive substrate in a projection exposure apparatus used for transferring a mask pattern onto the photosensitive substrate by 10 lithography for manufacturing devices such as semiconductor devices, liquid-crystal display devices, imaging devices, and thin-film magnetic heads.

BACKGROUND ART

A surface position detecting apparatus of an oblique incidence 15 type disclosed in Japanese Patent Application Laid-open No. 2001-296105 (Patent Document 1) by the same applicant is known as a conventional surface position detecting apparatus suitable for projection exposure apparatus. In order to theoretically enhance the detection accuracy of the surface position of a detection target surface in this 20 surface position detecting apparatus of the oblique incidence type, it is necessary to set an angle of incidence of a beam to the detection target surface large (or close to 90°). In this case, it is suggested that parallelogram prisms with a pair of internal reflection surfaces parallel to each other (which will be referred to hereinafter as "rhomboid 25 prisms") are disposed in respective optical paths of the projecting optical system and the condensing optical system to locate the projecting optical system and the condensing optical system away from the detection target surface (cf. FIG. 7 in Patent Document 1).

Patent Document 1: U.S. Pat. No. 6,897,462.

DISCLOSURE OF THE INVENTION

Problem to be Solved by the Invention

In the conventional surface position detecting apparatus disclosed in FIG. 7 of Patent Document 1 described above, however, there appears a relative positional deviation between polarization components in the beam totally reflected on the two mutually parallel internal reflection surfaces of the projection-side rhomboid prism, so that there is a possibility that any clear pattern image cannot be formed on the detection target surface. Likewise, there also appears a relative positional deviation between polarization components in the beam reflected from the detection target surface and then totally reflected on the two mutually parallel internal reflection surfaces of the reception-side rhomboid prism, so that there is a possibility that a secondary image of the pattern can become more unclear.

On the other hand, when the conventional surface position detecting apparatus is applied to detection of a surface position of a wafer (photosensitive substrate) whose surface is coated with a resist, in an exposure apparatus, it is known that the reflectance for light of a specific polarization component varies depending upon the thickness of the resist layer. As a consequence, the conventional surface position detecting apparatus tends to make a detection error of the surface position of the detection target surface because of the relative positional deviations between polarization components in the beam totally reflected on the internal reflection surfaces of the rhomboid prisms and the variation in the reflectance due to the thickness of the resist layer on the photosensitive substrate.

Means for Solving the Problem

In order to solve the above problem, a first aspect of the present invention provides a surface position detecting apparatus comprising a light projection system which projects a beam from an oblique direction onto a detection target surface, and a light reception system which receives a beam reflected on the detection target surface, the surface position detecting apparatus being adapted to detect a surface position of the detection target surface on the basis of an output from the light reception system, wherein at least one of the light projection system and the light reception system comprises a total reflection prism member having an internal reflection surface which totally reflects an incident beam, and wherein, for restraining influence of a relative positional deviation between polarization components of the beam totally reflected on the internal reflection surface of the total reflection prism member, on detection of the surface position of the detection target surface, a refractive index of an optical material forming the total reflection prism member and an angle of incidence of the incident beam to the internal reflection surface of the total reflection prism member are set so as to satisfy a predetermined relation.

A second aspect of the present invention provides an exposure apparatus which projects a predetermined pattern through a projection optical system onto a photosensitive substrate to effect exposure thereof, comprising:

the surface position detecting apparatus of the first aspect which detects a surface position of a surface of the predetermined pattern or an exposed surface of the photosensitive substrate relative to the projection optical system, as the surface position of the detection target surface; and a positioning apparatus which positions the surface of the predetermined pattern or the exposed surface of the photosensitive substrate relative to the projection optical system, based on a detection result by the surface position detecting apparatus.

A third aspect of the present invention provides a device manufacturing method comprising:

an exposure step of effecting exposure of the photosensitive substrate with the predetermined pattern, using the exposure apparatus of the second aspect; and a development step of developing the photosensitive substrate exposed in the exposure step.

A fourth aspect of the present invention provides an optical apparatus in which an optical member having a total reflection surface is disposed in an optical path, wherein a refractive index of the optical member and an angle of incidence of light to the total reflection surface are set so as to restrain a relative positional deviation between polarization components of light totally reflected on the total reflection surface of the optical member.

A fifth aspect of the present invention provides an optical apparatus comprising N internal reflection surfaces in an optical path, wherein angles of incidence of light to the respective N internal reflection surfaces and refractive indices of respective optical members forming the N internal reflection surfaces are set so that a relative positional deviation between polarization components of light totally reflected on the N internal reflection surfaces becomes substantially zero.

A sixth aspect of the present invention provides a measuring apparatus in which an optical member having a total reflection surface is disposed in a measurement optical path, wherein a refractive index of the optical member and an angle of incidence of measurement light to the total reflection surface are set so as to restrain a relative positional deviation between polarization components of the measurement light totally reflected on the total reflection surface of the optical member.

A seventh aspect of the present invention provides a measuring apparatus which measures a measurement target surface, comprising:

a detector which detects measurement light from the measurement target surface; and an optical member with a total reflection surface disposed in an optical path between the measurement target surface and the detector, wherein, for restraining a relative positional deviation between polarization components of the measurement light totally reflected on the total reflection surface of the optical member, a refractive index of the optical member and an angle of incidence of the measurement light to the total reflection surface are set.

An eighth aspect of the present invention provides a measuring apparatus which measures a measurement target surface, comprising:

a light projection system which guides measurement light to the measurement target surface;

a light reception system which receives the measurement light from the measurement target surface; and an optical member with a total reflection surface disposed in at least one of an optical path of the light projection system and an optical path of the light reception system, wherein, for restraining a relative positional deviation between polarization components of the measurement light totally reflected on the total reflection surface of the optical member, a refractive index of the optical member and an angle of incidence of the measurement light to the total reflection surface of the optical member are set.

A ninth aspect of the present invention provides a measuring apparatus comprising N internal reflection surfaces in an optical path, wherein angles of incidence of light to the respective N internal reflection surfaces and refractive indices of respective optical members forming the N internal reflection surfaces are set so that a relative positional deviation between polarization components of light totally reflected on the N internal reflection surfaces becomes substantially zero.

A tenth aspect of the present invention provides an exposure apparatus which effects exposure of a photosensitive substrate with a predetermined pattern, comprising:

the measuring apparatus of the sixth aspect, the seventh aspect, the eighth aspect, or the ninth aspect which measures a position of the photosensitive substrate.

An eleventh aspect of the present invention provides a device manufacturing method comprising:

an exposure step of effecting exposure of the photosensitive substrate with the predetermined pattern, using the exposure apparatus of the tenth aspect; and a development step of developing the photosensitive substrate exposed in the exposure step.

A twelfth aspect of the present invention provides an optical apparatus comprising: at least one optical member disposed in an optical path and having a total reflection surface; and an adjusting device for adjusting a relative positional deviation between polarization components of light totally reflected on the total reflection surface of the at least one optical member.

A thirteenth aspect of the present invention provides an adjustment method comprising: a step of disposing at least one optical member having a total reflection surface, in an optical path; and a step of adjusting a relative positional deviation between polarization components of light caused at the total reflection surface of the at least one optical member.

A fourteenth aspect of the present invention provides an adjustment method comprising: a step of guiding light to at least one optical member having a total reflection surface; a step of detecting a relative positional deviation between polarization components of the light caused at the total reflection surface of the at least one optical member; and a step of adjusting an angle of incidence of the light incident to the total reflection surface of the at least one optical member.

BEST MODE FOR CARRYING OUT THE INVENTION

Figure 1:
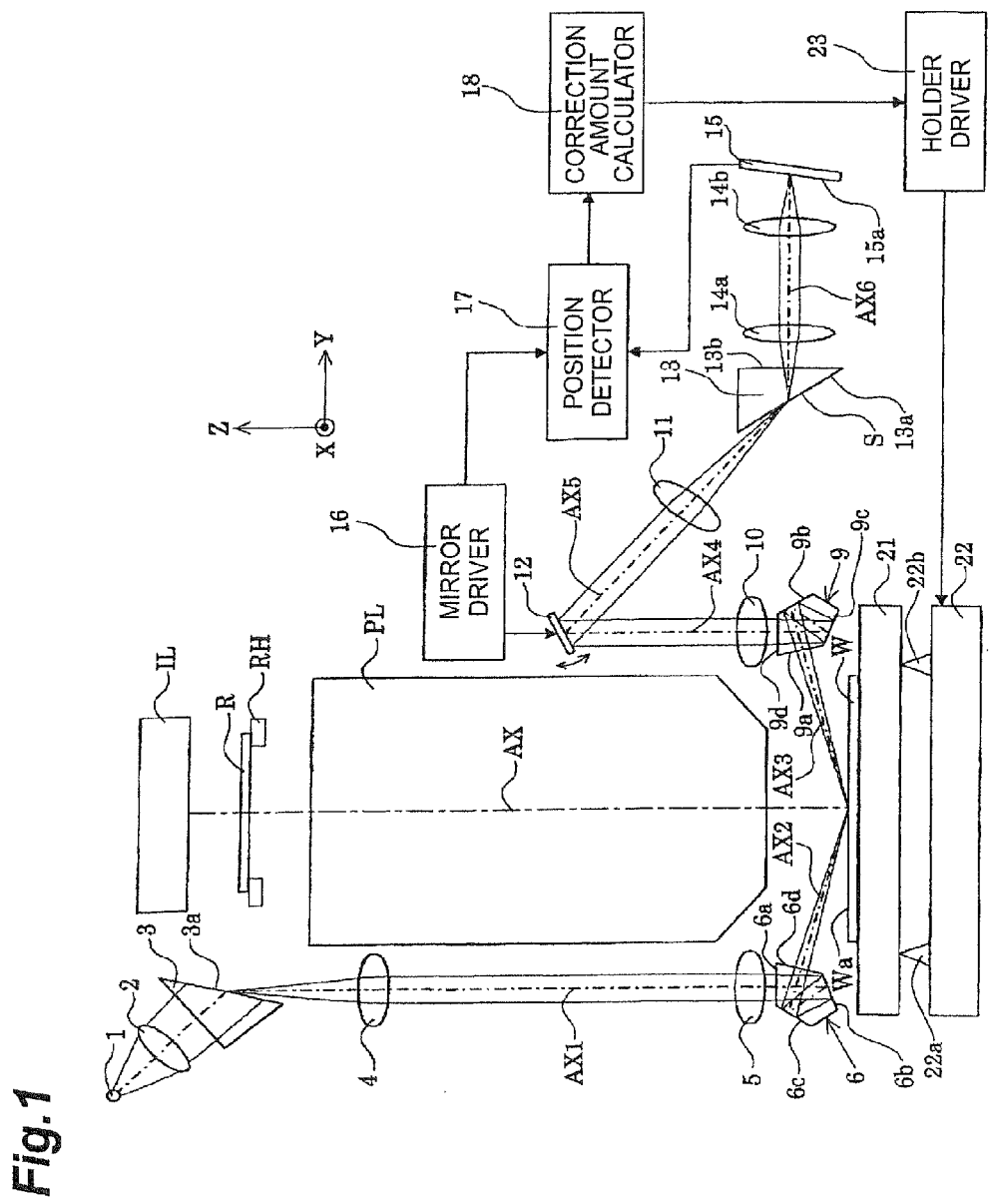
FIG. 1 is a drawing schematically showing a configuration of an exposure apparatus with a surface position detecting apparatus according to an embodiment of the present invention.
Figure 2:
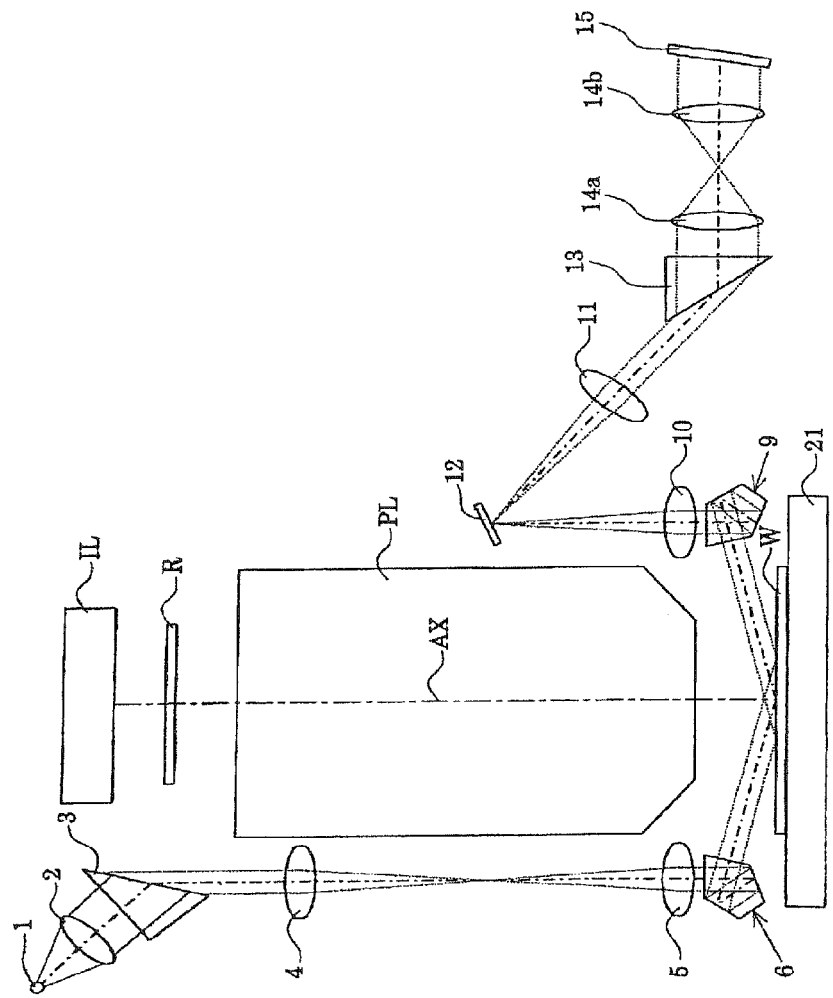
FIG. 2 is an optical path diagram showing that a projecting optical system and a condensing optical system in FIG. 1 both are telecentric on both sides.
Figure 3:
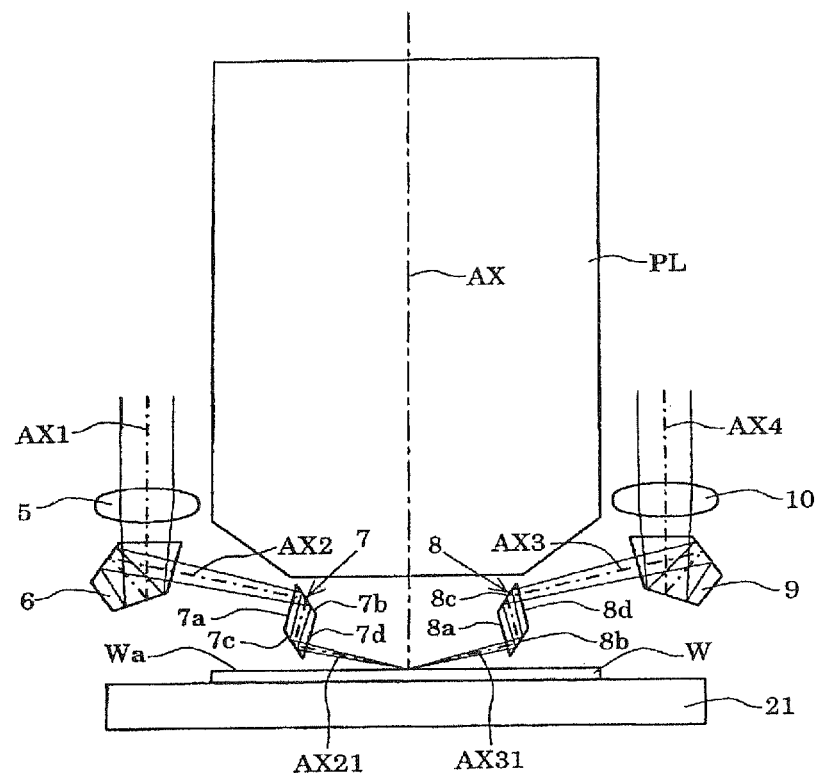
FIG. 3 is a drawing schematically showing a configuration between a pair of pentagonal prisms in the surface position detecting apparatus of the embodiment.

Embodiments of the present invention will be described on the basis of the accompanying drawings. FIG. 1 is a drawing schematically showing a configuration of an exposure apparatus with a surface position detecting apparatus according to an embodiment of the present invention. FIG. 2 is an optical path diagram showing that a projecting optical system and a condensing optical system in FIG. 1 both are telecentric on both sides. FIG. 3 is a drawing schematically showing a configuration between a pair of pentagonal prisms in the surface position detecting apparatus of the present embodiment.

FIG. 1 and FIG. 2 are depicted without illustration of the configuration between a pair of pentagonal prisms 6 and 9, for clarification of the drawings. In FIG. 1, the Z-axis is set in parallel with the optical axis AX of a projection optical system PL, the Y-axis in parallel with the plane of FIG. 1 in a plane perpendicular to the optical axis AX, and the X-axis perpendicularly to the plane of FIG. 1. In the present embodiment, the surface position detecting apparatus of the present invention is applied to detection of a surface position of a photosensitive substrate in a projection exposure apparatus.

The exposure apparatus shown is provided with an illumination system IL for illuminating a reticle R as a mask with a predetermined pattern formed therein, with illumination light (exposure light) emitted from a light source for exposure (not shown). The reticle R is held in parallel with the XY plane on a reticle stage (not shown), through a reticle holder RH. The reticle stage is two-dimensionally movable along the reticle surface (or the XY plane) by action of an unrepresented driving system, position coordinates thereof are measured by a reticle interferometer (not shown), and the reticle stage is arranged to be controlled in position.

Light from the pattern formed in the reticle R travels through the projection optical system PL to for in a reticle pattern image on a surface (exposed surface) Wa of a wafer W being a photosensitive substrate. The wafer W is mounted on a wafer holder 21 and the wafer holder 21 is supported by a holder holding mechanism 22. The holder holding mechanism 22 supports the wafer holder 21 at three support points 22a-22c (among which only two support points 22a and 22b are shown in FIG. 1) movable vertically (in the Z-direction), based on control of a holder driving unit 23.

In this configuration, the holder driving unit 23 controls each of vertical movements of the respective support points 22a-22c of the holder holding mechanism 22 to perform leveling (horizontal positioning) and Z-directional (focusing) movement of the wafer holder 21 and, in turn, leveling and Z-directional movement of the wafer W. The wafer holder 21 and the holder holding mechanism 22 are further supported by a wafer stage (not shown). The wafer stage is two-dimensionally movable along a wafer surface (or the XY plane) and rotatable around the Z-axis by action of an unrepresented driving system, position coordinates thereof are measured by a wafer interferometer (not shown), and the wafer stage is arranged to be controlled in position.

For suitably transferring a circuit pattern on the pattern surface of the reticle R into each exposure area on the exposed surface Wa of the wafer W, it is necessary to position a current exposure area on the exposed surface Wa, within a width of the depth of focus centered on the image plane by the projection optical system PL, on every occasion of exposure into each exposure area. It can be met by the following operation: a surface position of each point in the current exposure area, i.e., the surface position along the optical axis AX of the projection optical system PL is accurately detected and thereafter the leveling and Z-directional movement of the wafer holder 21, therefore, the leveling and Z-directional movement of the wafer W, is implemented so as to keep the exposed surface Wa within the range of the width of the focal depth of the projection optical system PL.

The projection exposure apparatus of the present embodiment is provided with the surface position detecting apparatus for detecting the surface position of each point in the current exposure area on the exposed surface Wa. With reference to FIG. 1, the surface position detecting apparatus of the present embodiment is provided with a light source 1 for supplying detection light. In general, the surface Wa of the wafer W as a detection target surface is coated with a thin film such as a resist. Therefore, in order to reduce influence of interference due to this thin film, the light source 1 is desirably a white light source with a wide wavelength band (e.g., a halogen lamp for supplying illumination light with the wavelength band of 600-900 nm, a xenon light source for supplying illumination light with a wide band equivalent thereto, or the like). The light source 1 can also be a light emitting diode for supplying light in a wavelength band where the resist demonstrates weak photosensitivity.

A diverging beam from the light source 1 is converted into a nearly parallel beam through a condenser lens 2 and then the nearly parallel beam is incident to a folding prism 3. The folding prism 3 deflects the nearly parallel beam from the condenser lens 2 into the −Z-direction by refraction. A transmissive grating pattern 3a is formed on the exit side of the folding prism 3 and in a structure in which transmitting portions and shield portions elongated in the X-direction are alternately provided at a fixed pitch. It is also possible to apply a reflective diffraction grating of an uneven shape or a reflective grating pattern with reflecting portions and non-reflecting portions being alternately formed, instead of the transmissive grating pattern.

The light transmitted by the transmissive grating pattern 3a is incident to a projecting optical system (4, 5) disposed along an optical axis AX1 parallel to the optical axis AX of the projection optical system. The projecting optical system (4, 5) is composed of a projection condensing lens 4 and a projection objective lens 5. The beam having passed through the projecting optical system (4, 5) is then incident to a pentagonal prism 6. The pentagonal prism 6 is a folding prism of a pentagonal prism shape whose longitudinal axis extends along the X-direction, and has a first transmission surface 6a for directly transmitting light incident along the optical axis AX1 without refraction thereof. Namely, the first transmission surface 6a is set perpendicularly to the optical axis AX1.

The light through the first transmission surface 6a propagates along the optical axis AX1 inside the pentagonal prism 6, is then reflected by a first reflection surface 6b, and thereafter is again reflected into an optical axis AX2 by a second reflection surface 6c. The light reflected by the second reflection surface 6c propagates along the optical axis AX2 inside the pentagonal prism 6 and then travels through a second transmission surface 6d, without being refracted. Namely, the second transmission surface 6d is set perpendicularly to the optical axis AX2. The pentagonal prism 6 is made of an optical material with low thermal expansion and low dispersion like silica glass and a reflecting film of aluminum, silver, or the like is formed on each of the first reflection surface 6b and the second reflection surface 6c.

In this manner, the light incident in the −Z-direction along the optical axis AX1 is largely deflected by the pentagonal prism 6 to be guided along the optical axis AX2 to the detection target surface Wa. At this time, the direction of the optical axis AX2 or, therefore, the angle of deflection by the pentagonal prism 6 is set so that an angle of incidence to the detection target surface Wa becomes sufficiently large. Specifically, as shown in FIG. 3, the beam emitted along the optical axis AX2 from the pentagonal prism 6 is incident to a projection-side rhomboid prism 7.

The rhomboid prism 7 is a prism of a quadrangular prism shape having a cross section of a parallelogram shape (or rhomboid shape), and the longitudinal axis thereof is arranged along the X-direction as that of the pentagonal prism 6 is. In the rhomboid prism 7, the light transmitted by a first transmission surface 7a perpendicular to the optical axis AX2 is successively reflected by a pair of reflection surfaces 7h and 7c parallel to each other, then travels through a second transmission surface 7d parallel to the first transmission surface 7a, and is exited along an optical axis AX21 parallel to the optical axis AX2, from the rhomboid prism 7. The beam emitted along the optical axis AX21 from the rhomboid prism 7 is then incident to the detection target surface Wa.

The apparatus is arranged as follows: in a state in which the detection target surface Wa is aligned with the image plane of the projection optical system PL, the projecting optical system (4, 5) keeps the patterned surface of the grating pattern 3a (or the exit surface of the folding prism 3) conjugate with the detection target surface Wa. Furthermore, the patterned surface of the grating pattern 3a and the detection target surface Wa are arranged so as to satisfy the Scheimpflug condition with respect to the projecting optical system (4, 5). As a result, the light from the grating pattern 3a is accurately focused throughout an entire pattern image-forming surface on the detection target surface Wa through the projecting optical system (4, 5).

Figure 4:
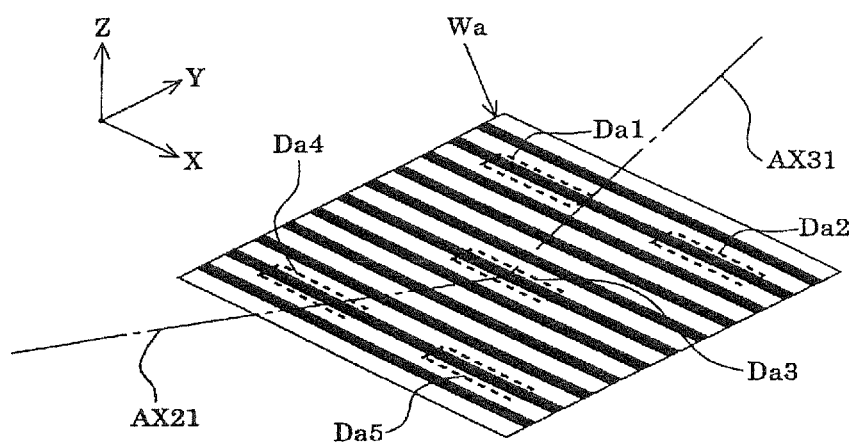
FIG. 4 is a perspective view showing a state in which a primary image of a grating pattern 3a is formed on a detection target surface Wa.

As indicated by dashed lines of an optical path in FIG. 2, the projecting optical system (4, 5) composed of the projection condensing lens 4 and the projection objective lens 5 is a so-called bi-telecentric optical system. Therefore, points on the patterned surface of the grating pattern 3a and conjugate points on the detection target surface Wa are kept each at the same magnification throughout the entire surface. In this way, a primary image of the grating pattern 3a is accurately formed throughout the entire region thereof, as shown in FIG. 4, on the detection target surface Wa.

Referring again to FIG. 3, the beam reflected on the detection target surface Wa into an optical axis AX31 symmetric with the optical axis AX21 with respect to the optical axis AX of the projection optical system PL is then incident to a reception-side rhomboid prism 8. The rhomboid prism 8, similar to the rhomboid prism 7, is a prism of a quadrangular prism shape having the longitudinal axis along the X-direction and a cross section of a parallelogram shape (or rhomboid shape). In the rhomboid prism 8, therefore, the light transmitted by a first transmission surface 8a perpendicular to the optical axis AX31 is successively reflected on a pair of reflection surfaces 8b and 8c parallel to each other, thereafter travels through a second transmission surface 8d parallel to the first transmission surface 8a, and is exited along an optical axis AX3 parallel to the optical axis AX31 from the rhomboid prism 8.

The light emitted along the optical axis AX3 from the rhomboid prism 8 travels through a pentagonal prism 9 having a configuration similar to the aforementioned pentagonal prism 6, to enter a condensing optical system (10, 11). Namely, the light reflected on the detection target surface Wa is incident to the pentagonal prism 9 along the optical axis AX3 symmetric with the optical axis AX2 with respect to the optical axis AX of the projection optical system PL. In the pentagonal prism 9, the light through a first transmission surface 9a perpendicular to the optical axis AX3 is successively reflected on a first reflection surface 9b and a second reflection surface 9c and thereafter travels along an optical axis AX4 extending in the Z-direction, to reach a second transmission surface 9d. The light through the second transmission surface 9d perpendicular to the optical axis AX4 is then incident in the +Z-direction and along the optical axis AX4 into the condensing optical system (10, 11).

The condensing optical system (10, 11) is composed of a reception objective lens 10 and a reception condensing lens 11. A vibrating mirror 12 as a scanning means is provided in the optical path between the reception objective lens 10 and the reception condensing lens 11. Therefore, the light incident along the optical axis AX4 into the reception objective lens 10 is deflected by the vibrating mirror 12 and travels along an optical axis AX5 to reach the reception condensing lens 11. In the present embodiment the vibrating mirror 12 is located at a position approximately coincident with the pupil plane of the condensing optical system (10, 11), but, without having to be limited to this, the vibrating mirror 12 can be located at any position in the optical path between the detection target surface Wa and after-described shift & tilt correction prism 13 or in the optical path between the detection target surface Wa and the folding prism 3.

The light having passed through the condensing optical system (10, 11) is then incident to the shift & tilt correction prism 13 having a configuration similar to the aforementioned folding prism 3. The apparatus is arranged as follows: in the state in which the detection target surface Wa is aligned with the image plane of the projection optical system PL, the condensing optical system (10, 11) keeps the detection target surface Wa conjugate with an entrance surface 13a of the shift & tilt correction prism 13. In this manner, a secondary image of the grating pattern 3a is formed on the entrance surface 13a of the shift & tilt correction prism 13.

Figure 5:
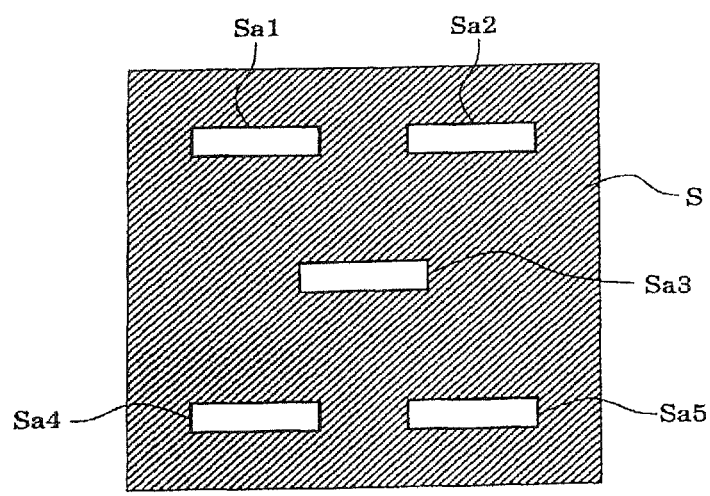
FIG. 5 is a drawing schematically showing a configuration of a light reception slit S having five rectangular apertures Sa1-Sa5 elongated in the X-direction.

A light reception slit S as a shield means is provided on the entrance surface 13a of the shift & tilt correction prism 13. The light reception slit S, as shown in FIG. 5, has, for example, five rectangular apertures Sa1-Sa5 elongated in the X-direction. The reflected light from the detection target surface Wa through the condensing optical system (10, 11) travels through each of the apertures Sa1-Sa5 of the light reception slit S to enter the shift & tilt correction prism 13.

The number of apertures Sa in the light reception slit S corresponds to the number of detection points on the detection target surface Wa. Namely, in FIG. 4 showing the state in which the primary image of the grating pattern 3a is formed on the detection target surface Wa, detection points (detection regions) Da1-Da5 on the detection target surface Wa optically correspond to the five apertures Sa1-Sa5 in the light reception slit S shown in FIG. 5. Therefore, when one desires to increase the number of detection points on the detection target surface Wa, it can be realized by simply increasing the number of apertures Sa, without complication of the configuration in connection with the increase in the number of detection points.

The image plane of the projection optical system PL and the entrance surface 13a of the shift & tilt correction prism 13 are arranged to satisfy the Scheimpflug condition with respect to the condensing optical system (10, 11). Therefore, in the state in which the detection target surface Wa is aligned with the image plane, the light from the grating pattern 3a is accurately re-focused throughout an entire pattern image-forming surface on the prism entrance surface 13a through the condensing optical system (10, 11).

As indicated by dashed lines of the optical path in FIG. 2, the condensing optical system (10, 11) is composed of a bi-telecentric optical system. Therefore, points on the detection target surface Wa and conjugate points on the prism entrance surface 13a are kept each at the same magnification throughout the entire surface. In this manner, the secondary image of the grating pattern 3a is accurately formed throughout an entire region thereof, on the entrance surface 13a of the shift & tilt correction prism 13.

Incidentally, when a light reception surface is located at the position of the entrance surface 13a of the shift & tilt correction prism 13, an angle of incidence of the beam to the light reception surface will be large because the incidence angle θ of the beam to the detection target surface Wa is large. In this case, for example, when a silicon photodiode is placed on the light reception surface, the angle of incidence of the beam to the silicon photodiode will be large and reflection will become significant on the surface of the silicon photodiode; therefore, there will occur an eclipse of the beam which could significantly lower a light reception amount.

In the present embodiment, in order to avoid the decrease in the light reception amount due to the angle of incidence of the beam to the light reception surface, the entrance surface 13a of the shift & tilt correction prism 13 as a folding optical system is located on a plane conjugate with the detection target surface Wa with respect to the condensing optical system (10, 11), as shown in FIG. 1. As a result, the beam incident along the optical axis AX5 to the entrance surface 13a of the shift & tilt correction prism 13 through the condensing optical system (10, 11) is deflected according to the same angle of refraction as an apex angle of the shift & tilt correction prism 13 (an angle between the entrance surface and the exit surface) to be emitted along an optical axis AX6 from the exit surface 13b. The exit surface 13b is set perpendicularly to the optical axis AX6.

Figure 6:
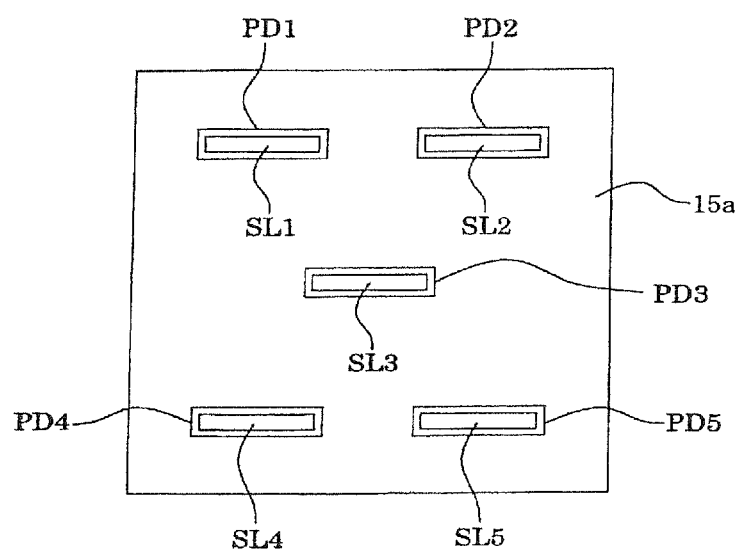
FIG. 6 is a drawing showing a state in which five silicon photodiodes PD1-PD5 are provided on a light reception surface 15a of a light reception unit 15 so as to optically correspond to the apertures Sa1-Sa5 of the light reception slit S.

The light emitted along the optical axis AX6 from the exit surface 13b of the shift & tilt correction prism 13 is then incident to a relay optical system (14a, 14b) composed of a pair of lenses 14a and 14b. The light through the relay optical system (14a, 14b) forms conjugate images of the secondary image of the grating pattern 3a and the apertures Sa1-Sa5 of the light reception slit S formed on the entrance surface 13a of the shift & tilt correction prism 13, on a light reception surface 15a of a light reception unit 15. On the light reception surface 15a, as shown in FIG. 6, five silicon photodiodes PD1-PD5 are provided so as to optically correspond to the apertures Sa1-Sa5 of the light reception slit S. A CCD (two-dimensional charge-coupled imaging device) or a photomultiplier tube can also be used instead of the silicon photodiodes.

Since the present embodiment uses the shift & tilt correction prism 13 as a folding optical system as described above, the angle of incidence of the beam to the light reception surface 15a is sufficiently small, so as to avoid the decrease in the light reception amount due to the angle of incidence of the beam to the light reception surface 15a. The relay optical system (14a, 14b) is desirably a bi-telecentric optical system as shown in FIG. 2. The entrance surface 13a of the shift & tilt correction prism 13 and the light reception surface 15a are desirably arranged to satisfy the Scheimpflug condition with respect to the relay optical system (14a, 14b).

As described above, the light reception slit S having the five apertures Sa1-Sa5 is provided on the entrance surface 13a of the shift & tilt correction prism 13. Therefore, the secondary image of the grating pattern 3a formed on the entrance surface 13a is partially blocked by the light reception slit S. Namely, only beams from the secondary image of the grating pattern 3a formed in the regions of the apertures Sa1-Sa5 of the light reception slit S travel through the shift & tilt correction prism 13 and the relay optical system (14a, 14b) to reach the light reception surface 15a.

In this manner, as shown in FIG. 6, images of the apertures Sa1-Sa5 of the light reception slit S, i.e., slit images SL1-SL5 are formed on the respective silicon photodiodes PD1-PD5 arranged on the light reception surface 15a of the light reception unit 15. The apparatus is so set that the slit images SL1-SL5 are formed inside respective rectangular reception regions of the silicon photodiodes PD1-PD5.

When the detection target surface Wa is vertically moved in the Z-direction and along the optical axis AX of the projection optical system PL, the secondary image of the grating pattern 3a formed on the entrance surface 13a of the shift & tilt correction prism 13 undergoes a horizontal shift in the pitch direction of the pattern corresponding to the vertical movement of the detection target surface Wa. In the present embodiment, an amount of the horizontal shift of the secondary image of the grating pattern 3a is detected by the principle of the photoelectric microscope disclosed, for example, in Japanese Patent Application Laid-open No. 6-97045 by the same applicant, and the surface position of the detection target surface Wa along the optical axis AX of the projection optical system PL is detected based on the detected horizontal shift amount.

The following units operate in the same manner as in the apparatus disclosed in Japanese Patent Application Laid-open No. 2001-296105 by the same applicant and thus the description thereof is omitted herein: mirror driving unit 16 for driving the vibrating mirror 12; position detecting unit 17 for performing synchronous detection of detection signals from the silicon photodiodes PD1-PD5 on the basis of an ac signal from the mirror driving unit 16; correction amount calculating unit 18 for calculating an inclination correction amount and a Z-directional correction amount necessary for keeping the detection target surface Wa within the range of the depth of focus of the projection optical system PL; holder driving unit 23 for driving and controlling the holder holding mechanism 22 on the basis of the inclination correction amount and Z-directional correction amount to effect leveling and Z-directional movement of the wafer holder 21.

The Scheimpflug condition, the configurations and actions of the folding prism 3 and shift & tilt correction prism 13, and specific application of the principle of the photoelectric microscope are disclosed in detail in Japanese Patent Application Laid-open No. 6-97045. The configurations and actions of the pentagonal prisms 6 and 9 are disclosed in detail in Japanese Patent Application Laid-open No. 2001-296105. It is also possible to adopt a configuration without either or both of these pentagonal prisms 6 and 9.

In the present embodiment the pentagonal prisms 6 and 9 are provided in the optical path between the projecting optical system (4, 5) and the detection target surface Wa and in the optical path between the condensing optical system (10, 11) and the detection target surface Wa, respectively, to fold the optical path of the incident beam to the detection target surface Wa and the optical path of the reflected beam from the detection target surface Wa by the actions of the pentagonal prisms 6 and 9, whereby the projecting optical system (4, 5) and the condensing optical system (10, 11) are set sufficiently away from the detection target surface Wa. As a consequence, the configurations and arrangements of the projecting optical system (4, 5) and the condensing optical system (10, 11) are substantially free from the restrictions of the detection target surface Wa.

Since in the present embodiment the rhomboid prisms 7 and 8 are additionally provided in the optical path between the pentagonal prism 6 and the detection target surface Wa and in the optical path between the pentagonal prism 9 and the detection target surface Wa, respectively, the optical path of the incident beam to the detection target surface Wa and the optical path of the reflected beam from the detection target surface Wa are shifted in parallel by the respective actions of the rhomboid prisms 7 and 8. As a consequence, the pair of pentagonal prisms 6 and 9 are set away from the detection target surface Wa and the configurations and arrangements of the pair of pentagonal prisms 6 and 9 and the holding members thereof are substantially free from the restrictions of the detection target surface Wa.

The surface position detecting apparatus of the present embodiment is provided with the projection-side prism member or rhomboid prism 7 disposed in the optical path of the light projection system and having a pair of internal reflection surfaces (7b, 7c) for effecting the parallel shift of the optical path of the incident beam, and the reception-side prism member or rhomboid prism 8 disposed corresponding to the projection-side prism member 7 in the optical path of the light reception system and having a pair of internal reflection surfaces (8b, 8c) for effecting the parallel shift of the optical path of the incident beam from the detection target surface Wa. In this case, as described above, there appears a relative positional deviation between polarization components in the beam totally reflected on the two mutually parallel internal reflection surfaces (7b, 7c) of the projection-side rhomboid prism 7, so that no clear pattern image can be formed on the detection target surface Wa. Since the projecting optical system (4, 5) and the condensing optical system (10, 11) are telecentric on the detection target surface side, principal rays all are incident at the same angle of incidence to the total reflection surfaces (7b, 7c, 8b, 8c) of the rhomboid prisms (7, 8).

Figure 7:
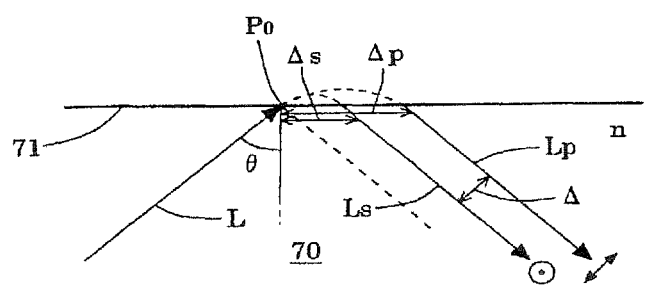
FIG. 7 is a drawing schematically showing a state in which there appears a relative positional deviation between polarization components in a beam totally reflected on an internal reflection surface of a prism.

FIG. 7 is a drawing schematically showing a state in which there appears a relative positional deviation between polarization components in a beam (a principal ray passing on the optical axis) totally reflected on an internal reflection surface of a prism. As shown in FIG. 7, when light L propagates inside the prism 70 and is incident at an angle of incidence over a predetermined value to the internal reflection surface 71, it is totally reflected on the internal reflection surface 71. At this time, the beam totally reflected on the internal reflection surface 71 includes a light component Ls in an s-polarized state with the direction of polarization along the direction normal to the plane of FIG. 7, and a light component Lp in a p-polarized state with the direction of polarization along the direction parallel to the plane of FIG. 7, and the light component Ls and the light component Lp propagate respectively along two mutually parallel optical paths spaced by a distance Δ inside the prism 70.

Here a relative positional deviation amount Δ between the polarization components caused in the beam totally reflected on the internal reflection surface 71 of the prism 70 is called a Goos-Haenchen Shift. In this way, the total reflection on the two mutually parallel internal reflection surfaces (7b, 7c) of the projection-side rhomboid prism 7 causes a relative positional deviation between the p-polarized light component and the s-polarized light component with respect to the detection target surface Wa in the beam reaching the detection target surface Wa, and, in turn, causes a relative positional deviation between a pattern image formed on the detection target surface Wa by the p-polarized light component and a pattern image formed on the detection target surface Wa by the s-polarized light component.

Similarly, there appears a relative positional deviation between polarization components in the beam totally reflected on the two mutually parallel internal reflection surfaces (8b, 8c) of the reception-side rhomboid prism 8 after reflected by the detection target surface Wa, so as to make more unclear the secondary image of the pattern formed on the entrance surface 13a of the shift & tilt correction prism 13. In other words, the influence of the total reflection on the internal reflection surfaces (8b, 8c) of the reception-side rhomboid prism 8 promotes (or doubles) the relative positional deviation caused between the secondary image of the pattern formed on the entrance surface 13a by the p-polarized light component and the secondary image of the pattern formed on the entrance surface 13a by the s-polarized light component.

The surface position detecting apparatus of the present embodiment is applied to detection of the surface position of the wafer W having various surface conditions during the semiconductor exposure process (e.g., a condition that a structure on the wafer W is composed of plural types of substances or a condition that a structure on the wafer W itself is composed of multiple types (multilayer structure)). In general, a wafer surface is in a state in which it is coated with a resist. Under such circumstances, when there is variation in various surface conditions (e.g., there is variation in thickness of a layer formed on the wafer or there is variation in a property such as purity of a material forming the layer) or when there is variation in resist thickness, the reflectance for light of a specific polarization component (e.g., the p-polarized light component, the s-polarized light component, or the like) varies depending upon these variations.

As a consequence, the surface position detecting apparatus of the present embodiment, without any extra countermeasures, is likely to make a detection error of the surface position of the detection target surface Wa because of the relative positional deviation between the polarization components caused in the beam totally reflected on the internal reflection surfaces (7b, 7c; 8b, 8c) of the rhomboid prisms (7; 8), and the variation in the reflectance of the specific polarization component due to the variation in the surface condition of the wafer W and the variation in the resist thickness.

As the projection exposure patterns become finer and finer in recent years, the requirements for flatness of the wafer surface are also becoming more exacting and the requirements for the detection accuracy of the surface position are also becoming extremely higher. In the case of the exposure apparatus and others using the ArF excimer laser light source, the thickness of the resist on the surface tends to become smaller and it is the present situation that we are unable to disregard the detection error of the surface position due to the various surface conditions and the variation in the resist thickness.

In the present embodiment, therefore, the refractive index n of the optical material forming each rhomboid prism (7; 8) as a total reflection prism member and the angle of incidence θ of the incident beam (principal ray traveling along the optical axis) to the internal reflection surfaces (7b, 7c; 8b, 8c) thereof are arranged to satisfy a predetermined relation, thereby restraining the influence of the relative positional deviation between the polarization components of the beam totally reflected on the internal reflection surfaces (7b, 7c; 8b, 8c) of the rhomboid prism (7; 8), on the detection of the surface position of the detection target surface Wa. The below will describe the relation to be satisfied by the refractive index n of the optical material forming each rhomboid prism (7; 8) and the angle of incidence θ of the incident beam (principal ray along the optical axis) to the internal reflection surfaces (7b, 7c; 8b, 8c).

Now, phase changes φp, φs of the p-polarized component and the s-polarized component at each internal reflection surface (7b, 7c, 8b, 8c) as a total reflection surface are represented by Eq (1) and Eq (2) below, respectively, where θ is an angle of incidence of a principal ray to the reflection surface (0°≤θ≤90°), λ the wavelength of the light, and n the refractive index of the optical material such as glass.

[Math 1]

$$\tan\frac{\phi_P}{2} = -\frac{n\sqrt{n^2\sin^2\theta - 1}}{\cos\theta} \quad (p\text{-polarized component}) \tag{1}$$

$$\tan\frac{\phi_S}{2} = -\frac{\sqrt{n^2\sin^2\theta - 1}}{n \cdot \cos\theta} \quad (s\text{-polarized component}) \tag{2}$$

A relative positional deviation amount Δp of reflection of the p-polarized component from a reference reflection position $P_0$ in a direction along the reflection surface (which will be referred to as the Goos-Haenchen Shift (GHS) of the p-polarized component) is given by partial differentiation of the phase change φ of the p-polarized component with respect to β, ∂φ/∂β, where the phase change of the p-polarized component is defined as β=n/λ·cos θ. Furthermore, a relative positional deviation amount Δs of reflection of the s-polarized component from the reference reflection position $P_0$ in the direction along the reflection surface (which will be referred to as the Goos-Haenchen Shift (GHS) of the s-polarized component) is given by partial differentiation of the phase change φ of the s-polarized component with respect to β, ∂φ/∂β, where the phase change of the s-polarized component is defined as β=n/λ·cos θ.

The relative positional deviation amounts Δp, Δs of the reflections of the respective polarization components are represented by Eq (3) and Eq (4) below, respectively.

[Math 2]

$$\Delta_P = \frac{\partial \phi_P}{\partial \beta} = \frac{\lambda}{\pi\sqrt{n^2\sin^2\theta - 1}} \cdot \tan\theta \quad (p\text{-polarized component}) \tag{3}$$

$$\Delta_S = \frac{\partial \phi_S}{\partial \beta} = \frac{\lambda}{\pi\sqrt{n^2\sin^2\theta - 1}} \cdot \tan\theta / (n^2\sin^2\theta + \sin^2\theta - 1) \tag{4}$$

(s-polarized component)

When a difference Δ between the relative phase deviation amounts of the p-polarized light component and the s-polarized light component of the reflected rays in the perpendicular direction (Goos-Haenchen Shift (GHS)) is determined from these, the following relation of Eq (5) holds because the relative phase deviation amount GHS between the reflections of the respective polarization components in the direction along the reflection surface is given by Δp−Δs.

$$\Delta = \cos\theta \times (\Delta p - \Delta s) \tag{5}$$

For this reason, the difference of Δ is made between the optical axes of the p-polarized light and the s-polarized light, as represented by Eq (6) below.

[Math 3]

$$\Delta = \frac{\lambda \tan\theta}{\pi\sqrt{n^2\sin^2\theta - 1}} \left(\frac{1}{n^2\sin^2\theta + \sin^2\theta - 1} - 1\right) \cdot \cos\theta \tag{6}$$

Therefore, the relative positional deviation amount Δ between the polarization components caused by one total reflection (internal reflection) in the prism (7; 8) can be represented by Eq (6) above. Therefore, the condition for nullifying the relative positional deviation between the polarization components in total reflection, i.e., the condition for zeroing the relative positional deviation amount Δ (Goos-Haenchen Shift (GHS)) between the polarization components caused in total reflection is to satisfy Eq (7) below.

[Math 4]

$$\sin^2\theta(n^2+1)=2 \qquad (7)$$

In the present embodiment, the refractive index n of the optical material forming the rhomboid prism (7; 8) as a total reflection prism member and the angle of incidence θ of the incident beam to the internal reflection surfaces (7b, 7c; 8b, 8c) are set so as to substantially satisfy the relation represented by Eq (7), whereby no substantial relative positional deviation occurs between the polarization components in the beam totally reflected by the internal reflection surfaces (7b, 7c; 8b, 8c) of the rhomboid prism (7; 8). As a result, a clear primary image of the pattern is formed on the surface Wa of the wafer W as a detection target surface and a clear secondary image of the pattern is formed on the entrance surface 13a of the shift & tilt correction prism 13; in turn, the surface position of the detection target surface Wa can be detected with high accuracy.

Accordingly, the exposure apparatus of the present embodiment is able to highly accurately detect the surface position of the exposed surface Wa of the wafer (photosensitive substrate) W, using the surface position detecting apparatus capable of detecting the surface position of the detection target surface with high accuracy, and, in turn, to highly accurately position the pattern surface of the reticle (mask) R and the exposed surface Wa of the wafer W relative to the projection optical system PL.

When the surface position detecting apparatus of the present embodiment is applied, for example, to the detection of the surface position of the photosensitive substrate or the detection of the surface position of the mask in the exposure apparatus, it is preferable in terms of practical use that the magnitude (absolute value) of the relative positional deviation amount Δ between the polarization components caused in one total reflection should be kept, for example, not more than 0.3 μm. Namely, when the apparatus satisfies Condition (8) below, there arises no practical problem in the detection of the surface position of the photosensitive substrate, the detection of the surface position of the mask, and so on. In Condition (8), however, the unit of the wavelength λ of light is μm.

[Math 5]

$$\frac{\lambda\tan\theta}{\pi\sqrt{n^2\sin^2\theta-1}}\left(\frac{1}{n^2\sin^2\theta+\sin^2\theta-1}-1\right)\cdot\cos\theta \leq 0.3(\mu m) \qquad (8)$$

Figure 8:
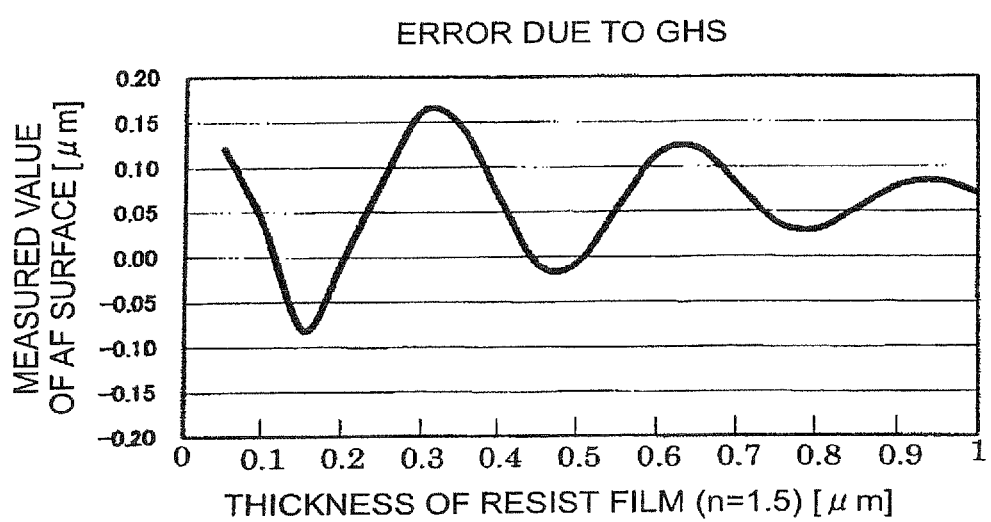
FIG. 8 is a drawing showing a relation between a relative positional deviation amount Δ (GHS) between polarization components caused in total reflection, and a measured value of an AF surface.

Let us explain here why it is preferable in terms of practical use that the magnitude of the relative positional deviation amount Δ (Goos-Haenchen Shift (GHS)) between the polarization components caused in total reflection should be not more than 0.3 μm. The required condition for accuracy of focus detection AF (surface detection and focus measurement) is that it should be smaller than the depth of focus of the projection optical system PL, and for recent large-NA projection lenses (focal depth: about 300 nm or less), it is the present status that a permissible width of AF error due to the resist thickness should be less than 50 nm in consideration of other errors. FIG. 8 shows a state of change of AF measured value against change of resist thickness, where the relative positional deviation amount Δ between the polarization components is 0.3 μm. It is seen that the AF measured value varies in the width of about 250 nm.

Figure 9:
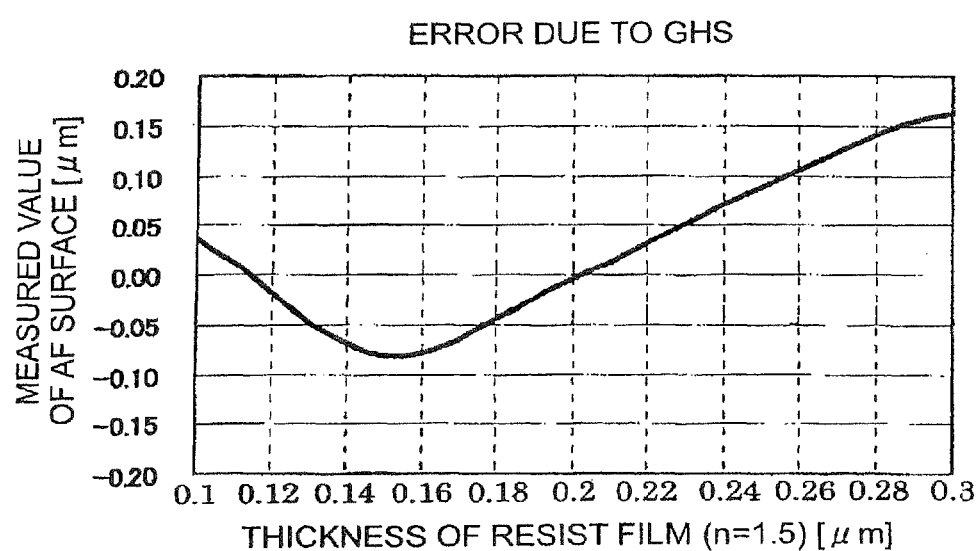
FIG. 9 is a partly enlarged view of FIG. 8.

FIG. 9 is an enlarged view of a partial region of FIG. 8. The resist thickness can have the variation of about ±10 nm in a wafer or among wafers, depending upon the performance of a film forming system. When the resist thickness varies in the width of 20 nm in FIG. 9, it is apparent from the drawing that the AF measured value can have a change of a little less than about 50 nm in the worst case. It is therefore understood that the relative positional deviation amount Δ between the polarization components is preferably kept not more than 0.3 μm. Furthermore, in order to realize stabler detection while achieving higher accuracy, the relative positional deviation amount Δ between the polarization components is more preferably kept not more than 0.2 μm, as represented by Condition (9) below.

[Math 6]

$$\frac{\lambda\tan\theta}{\pi\sqrt{n^2\sin^2\theta-1}}\left(\frac{1}{n^2\sin^2\theta+\sin^2\theta-1}-1\right)\cdot\cos\theta \leq 0.2(\mu m) \qquad (9)$$

The following will describe why it is preferable in terms of practical use that the magnitude of the relative positional deviation amount Δ (Goos-Haenchen Shift (GHS)) between the polarization components caused in total reflection should be kept not more than 0.2 μm. The change of AF measured value is proportional to the relative positional deviation amount Δ between the polarization components and when the relative positional deviation amount Δ between the polarization components is not more than 0.2 μm, the change amount of AF measured value becomes approximately 30 nm. When the error is 30 nm, there is a margin of about 20 nm with respect to the minimum requisite amount of 50 nm and this quantity is equivalent to an AF measurement error when an AF optical system has chromatic aberration due to a manufacturing error. Therefore, even with the error due to chromatic aberration caused by the manufacturing error, stable measurement can be always implemented with high accuracy as long as the relative positional deviation amount Δ between the polarization components is not more than 0.2 μm.

Figure 10:
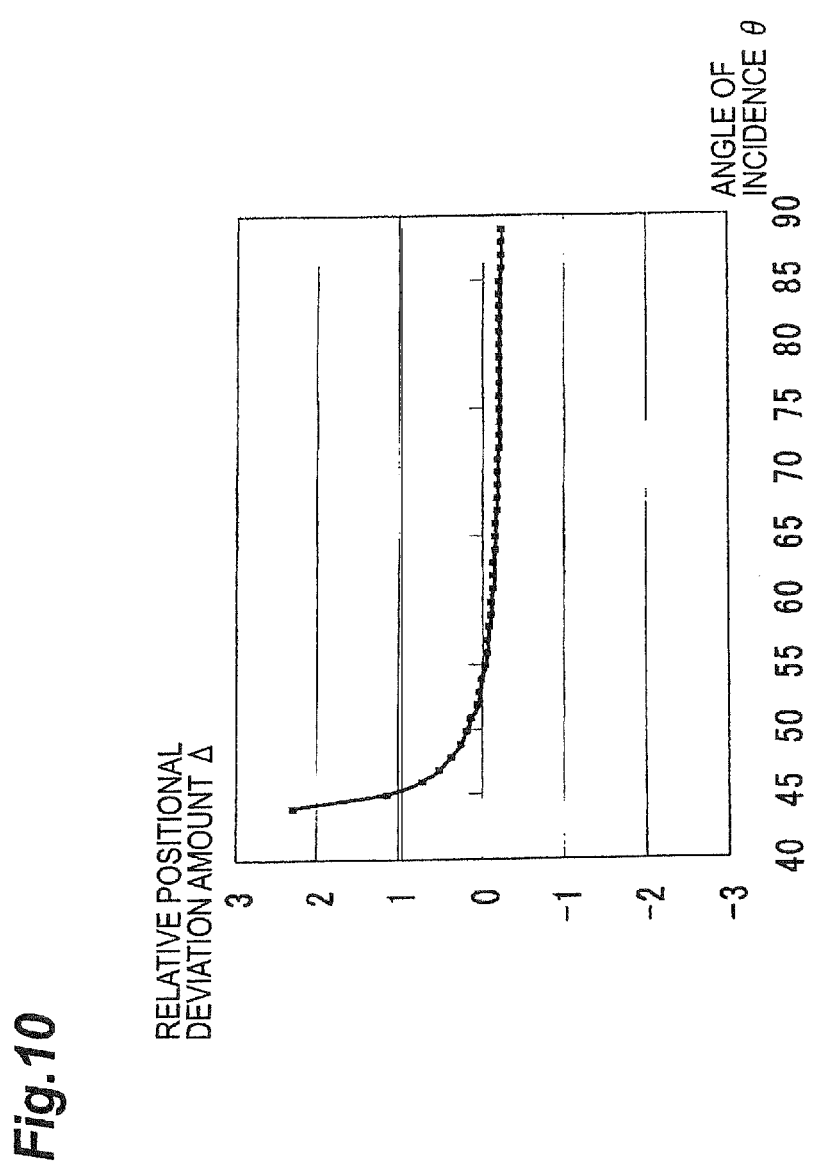
FIG. 10 is a drawing showing a relation between an angle of incidence to a total reflection surface and a relative positional deviation amount between polarization components.

Now, let us consider the relationship to be satisfied by the refractive index n of the optical material forming the rhomboid prism (7; 8) and the angle of incidence θ of the incident beam to the internal reflection surfaces (7b, 7c; 8b, 8c) in accordance with more specific forms. FIG. 10 is a drawing showing a relation between an angle of incidence to a total reflection surface and a relative positional deviation amount between polarization components. In FIG. 10, the vertical axis represents the relative positional deviation amount Δ (μm) between polarization components and the horizontal axis the angle of incidence θ (°) to the total reflection surface.

The sign convention for the relative positional deviation amount Δ is defined as follows: the relative positional deviation amount Δ is positive when the totally reflected s-polarized light component Ls and p-polarized light component Lp are in the positional relationship of FIG. 7 (or when the s-polarized light component Ls is inside the p-polarized light component Lp); the relative positional deviation amount Δ is negative when the p-polarized light component Lp is inside the s-polarized light component Ls. The same also applies to FIG. 11 and FIGS. 13 to 16 described below.

FIG. 10 shows the relation between the incidence angle θ and the relative positional deviation amount Δ in a case where the refractive index n of the optical material forming the prism (e.g., silica glass) is 1.45 and where the center wavelength λc of used light (detection light) is 750 nm. With reference to FIG. 10, the total reflection starts to occur at the incidence angle θ of about 43° and the relative positional deviation amount Δ in the positive range monotonically decreases with increase in the incidence angle θ from the total reflection angle. When the incidence angle θ shortly reaches approximately 53°, the relative positional deviation amount Δ becomes approximately zero; as the incidence angle θ further increases from about 53°, the relative positional deviation amount Δ becomes negative and the magnitude thereof monotonically increases.

In this case, when the center wavelength λc of used light is changed, the value of relative positional deviation amount Δ varies for the same incidence angle θ. As apparent from Eqs (6) and (7) described above, however, there is no substantial change in the value of incidence angle θ at the relative positional deviation amount Δ of 0, even with change in the center wavelength λc of used light. In other words, the value of incidence angle θ at the relative positional deviation amount Δ of 0 is substantially independent of the center wavelength λc of used light.

In the present embodiment, as described above, where the rhomboid prism (7; 8) is made of the optical material with the predetermined refractive index n, the incidence angle θ of the incident beam to the internal reflection surfaces (7b, 7c; 8b, 8c) can be determined so that the relative positional deviation amount Δ between the polarization components of the beam totally reflected by the internal reflection surfaces (7b, 7c; 8b, 8c) of the prism becomes approximately zero, i.e., so that the absolute value of the relative positional deviation amount Δ becomes, for example, not more than 0.3 μm and more preferably not more than 0.2 μm. It is seen from FIG. 10 that the degree of change of the relative positional deviation amount Δ is small against variation of the incidence angle θ and thus that a mounting error of the rhomboid prism (7; 8) or the like will cause little influence on the detection accuracy.

Figure 11:
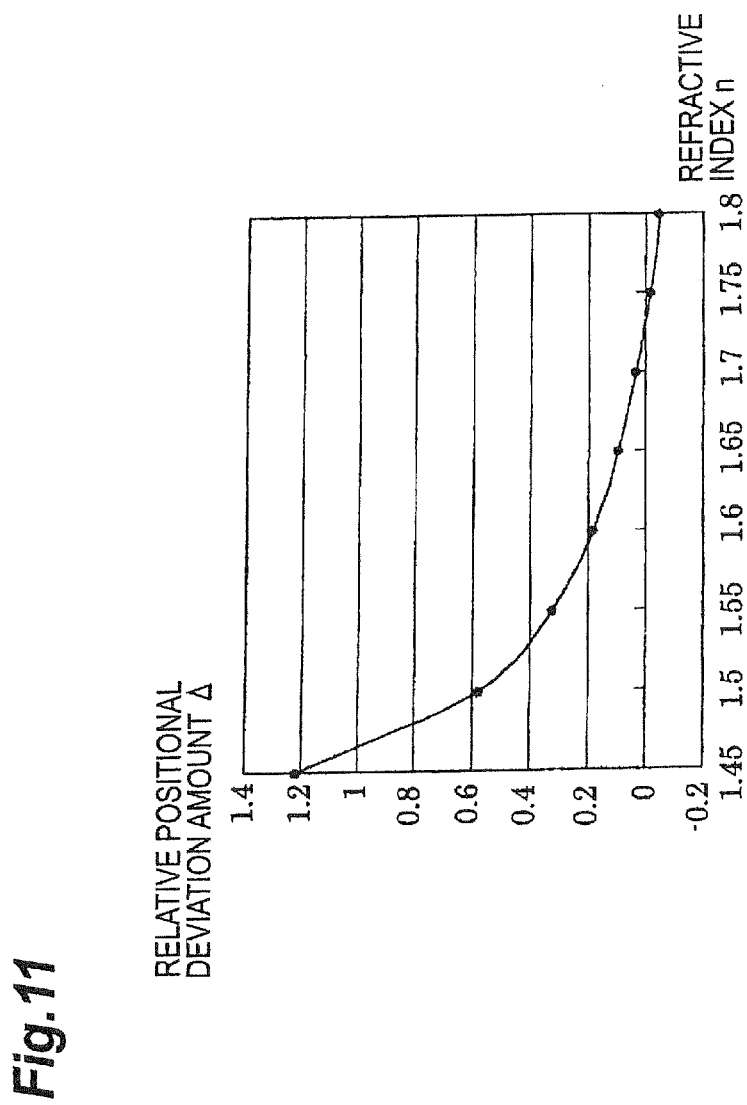
FIG. 11 is a drawing showing a relation between a refractive index of a prism and a relative positional deviation amount between polarization components.

FIG. 11 is a drawing showing a relation between the refractive index of the prism and the relative positional deviation amount between polarization components. In FIG. 11, the vertical axis represents the relative positional deviation amount Δ (μm) between polarization components and the horizontal axis the refractive index n of the optical material forming the prism. FIG. 11 shows the relationship between the refractive index n and the relative positional deviation amount Δ in a case where the incidence angle θ to a total reflection surface is 45° and where the center wavelength λc of used light is 750 nm. With reference to FIG. 11, the relative positional deviation amount Δ in the positive range monotonically decreases with increase in the refractive index n from 1.45 and the relative positional deviation amount Δ becomes approximately zero at the refractive index n of about 1.73. As the refractive index n further increases from about 1.73, the relative positional deviation amount Δ becomes negative and the magnitude thereof monotonically increases.

In this case, the value of relative positional deviation amount Δ also changes for the same refractive index n with change in the center wavelength λc of used light, whereas the value of refractive index n at the relative positional deviation amount Δ of 0 has no substantial change. In the present embodiment, as described above, where the rhomboid prism (7; 8) is configured to totally reflect light incident at a predetermined incidence angle θ to the internal reflection surfaces (7b, 7c; 8b, 8c), the refractive index n of the optical material forming the rhomboid prism (7; 8) can be determined so that the relative positional deviation amount Δ between the polarization components of the totally reflected beam becomes approximately zero, i.e., so that the absolute value of the relative positional deviation amount Δ becomes, for example, not more than 0.2 μm.

In the aforementioned embodiment shown in FIGS. 1 to 3, the four total reflection surfaces (7b, 7c; 8b, 8c) are disposed in the optical path to guide the light from the projecting optical system (4, 5) through the pentagonal prism 6 and the rhomboid prism 7 to the detection target surface Wa and to guide the light from the detection target surface Wa through the rhomboid prism 8 and the pentagonal prism 9 to the condensing optical system (10, 11). There are, however, no particular restrictions on the number and arrangement of total reflection surfaces, but it is also possible, for example, to adopt a configuration in which two total reflection surfaces (31b; 32b) are disposed in the optical path, as shown in FIG. 12.

Figure 12:
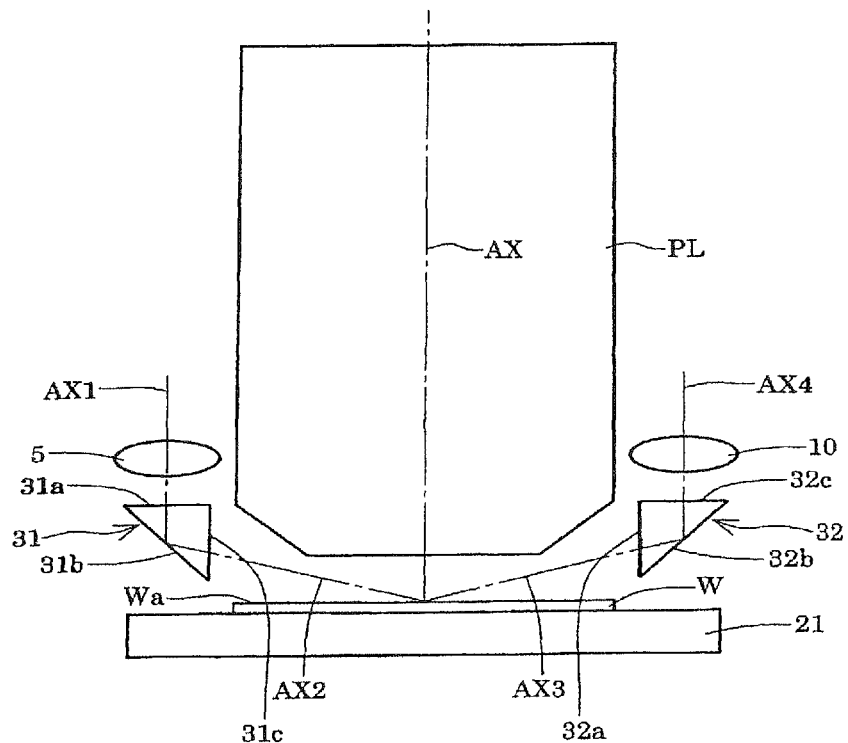
FIG. 12 is a drawing schematically showing a major configuration in a modification example of the embodiment.

In the modification example of FIG. 12, the light from the projecting optical system (4, 5) is guided through a triangular prism 31 as a path folding prism to the detection target surface Wa and the light from the detection target surface Wa is guided through a triangular prism 32 as a path folding prism to the condensing optical system (10, 11). It is noted that FIG. 12 is depicted without illustration of the projection condensing lens 4 and the reception condensing lens 11, corresponding to FIG. 3.

In the modification example of FIG. 12, the light emitted along the optical axis AX1 from the projecting optical system (4, 5) is incident to the path folding prism 31. In the path folding prism 31, the light through a first transmission surface 31a is totally reflected on a total reflection surface 31b, passes through a second transmission surface 31c, and is then emitted along the optical axis AX2 from the path folding prism 31. The light emitted along the optical axis AX2 from the path folding prism 31 is incident to the detection target surface Wa.

The light reflected along the optical axis AX3, which is symmetric with the optical axis AX2 with respect to the optical axis AX of the projection optical system PL, by the detection target surface Wa is then incident to the path folding prism 32. In the path folding prism 32, the light passing through a first transmission surface 32a is totally reflected on a total reflection surface 32b, then passes through a second transmission surface 32c, and is emitted along the optical axis AX4 from the path folding prism 32. The light emitted along the optical axis AX4 from the path folding prism 32 is then incident to the condensing optical system (10, 11).

In the modification example of FIG. 12, the refractive index n of the optical material forming the path folding prism (31; 32) as a total reflection prism member and the angle of incidence θ of the light to the total reflection surface (31b; 32b) thereof are set so as to substantially satisfy the relation of Eq (7), whereby the surface position of the detection target surface Wa can be detected with high accuracy, while restraining the influence of the relative positional deviation between the polarization components caused in the totally reflected light on the total reflection surface (31b; 32b) of the path folding prism (31; 32), on the detection of the surface position of the detection target surface Wa.

In other words, for detecting the surface position of the detection target surface Wa with high accuracy while restraining the influence of the relative positional deviation between polarization components caused in the light totally reflected on the total reflection surface (31b; 32b) of the path folding prism (31; 32), on the detection of the surface position of the detection target surface Wa, the refractive index n of the path folding prism (31; 32) and the incidence angle θ of the incident light to the total reflection surface (31b; 32b) can be determined so that the relative positional deviation amount Δ between the polarization components of the light totally reflected on the total reflection surface (31b; 32b) becomes approximately zero, i.e., so that the absolute value of the relative positional deviation amount Δ between the polarization components caused in one total reflection becomes, for example, not more than 0.3 µm and more preferably not more than 0.2 µm.

Figure 13:
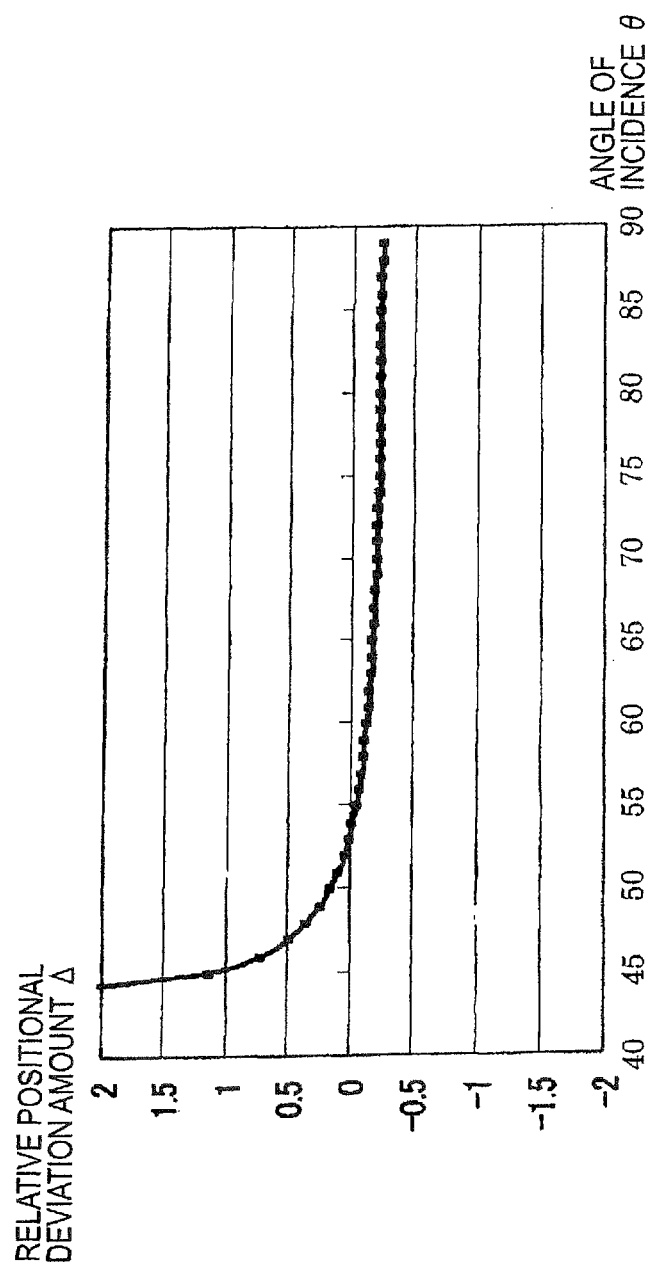
FIG. 13 is a drawing to illustrate a range of incidence angle θ to keep the absolute value of relative positional deviation amount Δ not more than 0.3 μm, where the refractive index n of a total reflection prism member is 1.45.

The following will describe a range of incidence angle θ where the absolute value of the relative positional deviation amount Δ between the polarization components caused in one total reflection becomes not more than 0.3 µm, with change in the refractive index n of the total reflection prism member, with reference to FIGS. 13 to 16. FIG. 13 shows a relation between the relative positional deviation amount Δ by one total reflection and the incidence angle θ in a case where the refractive index n of the total reflection prism member is 1.45 and where the center wavelength λc of light is 750 nm. It is seen from FIG. 13 that the range of incidence angle θ may be set to be approximately from 48° to 90°, in order to satisfy Condition (8) while the absolute value of the relative positional deviation amount Δ between the polarization components caused in one total reflection is kept not more than 0.3 µm. The incidence angle θ is about 53° when the relative positional deviation amount Δ is approximately zero.

Figure 14:
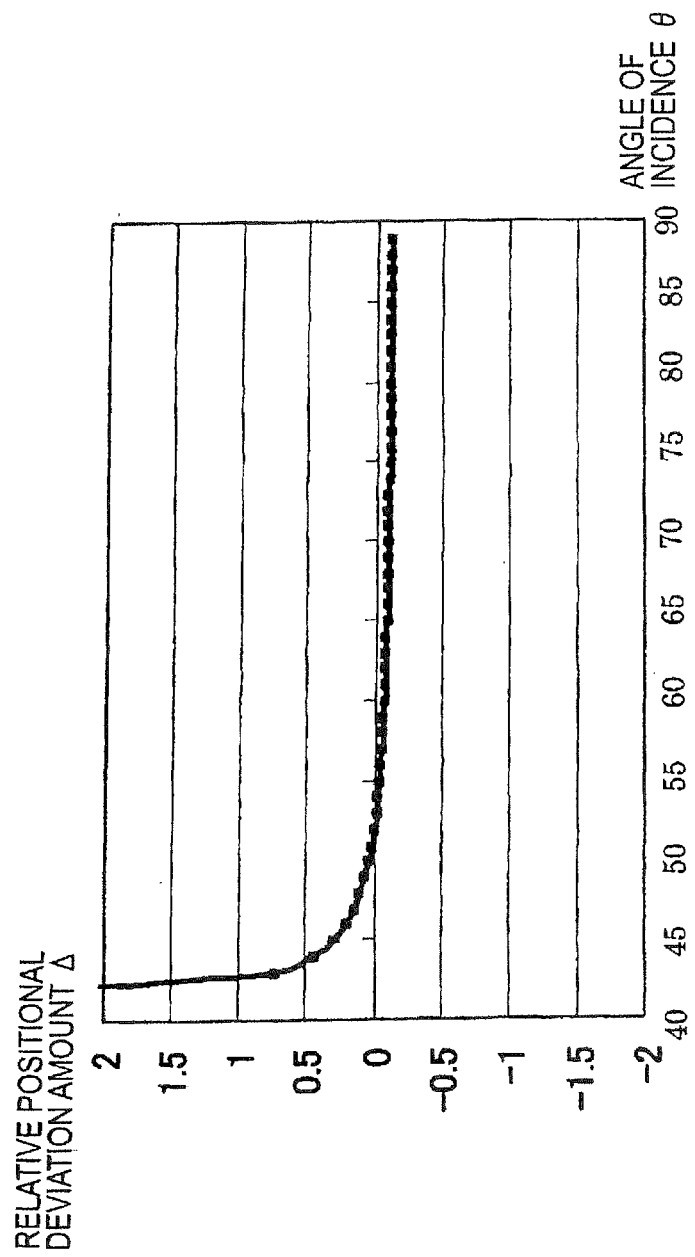
FIG. 14 is a drawing to illustrate a range of incidence angle θ to keep the absolute value of relative positional deviation amount Δ not more than 0.3 μm, where the refractive index n of a total reflection prism member is 1.5.

FIG. 14 shows a relation between the relative positional deviation amount Δ by one total reflection and the incidence angle θ in a case where the refractive index n of the total reflection prism member is 1.5 and where the center wavelength λc of light is 750 nm. It is seen from FIG. 14 that the range of incidence angle θ may be set to be approximately from 45° to 90°, in order to satisfy Condition (8) while the absolute value of the relative positional deviation amount Δ between the polarization components caused in one total reflection is kept not more than 0.3 µm. The incidence angle θ is about 52° when the relative positional deviation amount Δ is approximately zero.

Figure 15:
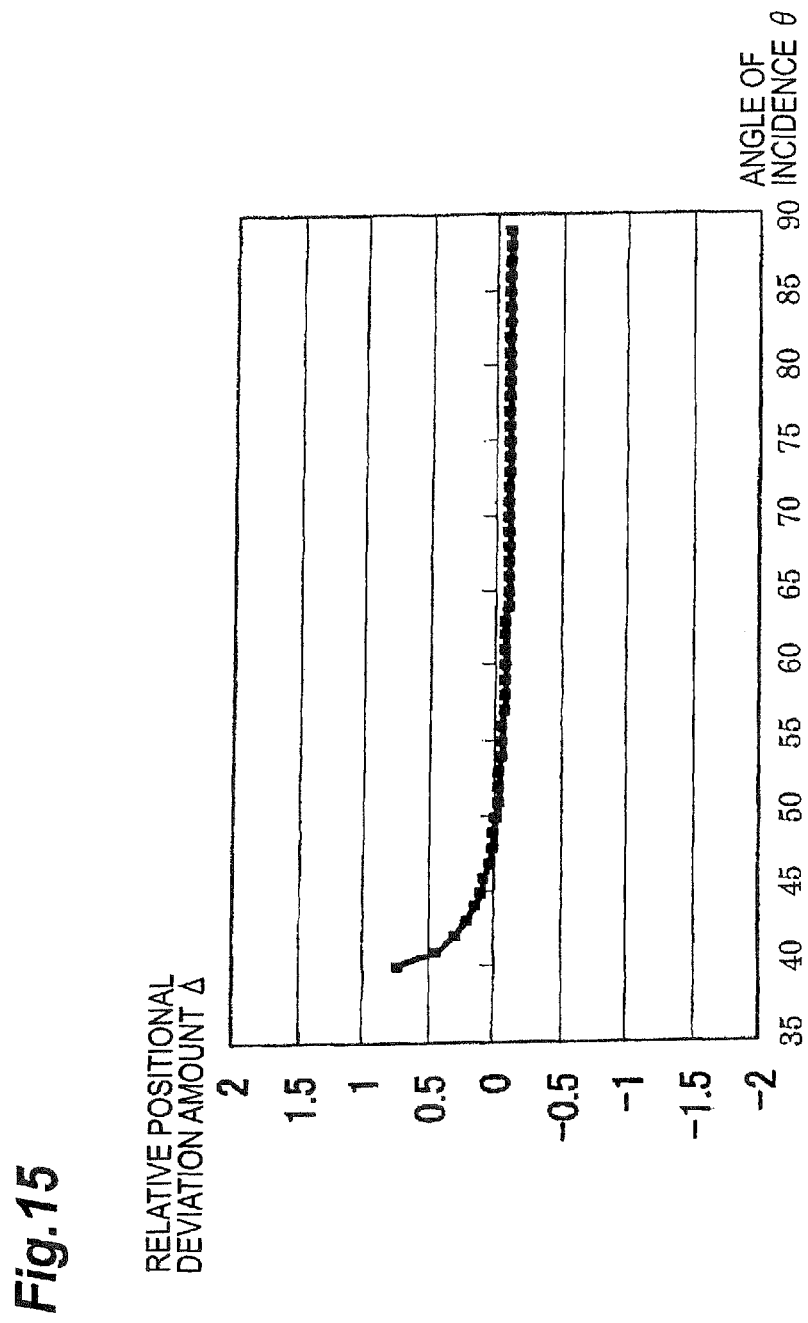
FIG. 15 is a drawing to illustrate a range of incidence angle θ to keep the absolute value of relative positional deviation amount Δ not more than 0.3 μm, where the refractive index n of a total reflection prism member is 1.6.

FIG. 15 shows a relation between the relative positional deviation amount Δ by one total reflection and the incidence angle θ in a case where the refractive index n of the total reflection prism member is 1.6 and where the center wavelength λc of light is 750 nm. It is seen from FIG. 15 that the range of incidence angle θ may be set to be approximately from 42° to 90°, in order to satisfy Condition (8) while the absolute value of the relative positional deviation amount Δ between the polarization components caused in one total reflection is kept not more than 0.3 µm. The incidence angle θ is about 49° when the relative positional deviation amount Δ is approximately zero.

Figure 16:
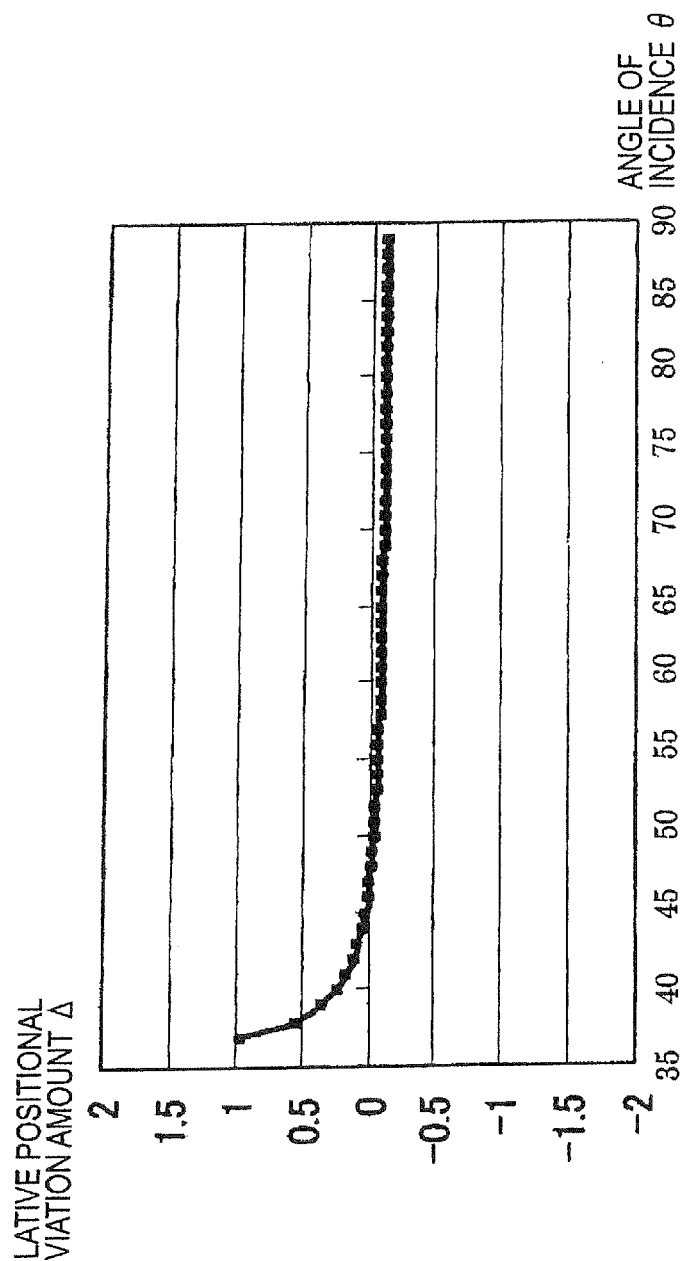
FIG. 16 is a drawing to illustrate a range of incidence angle θ to keep the absolute value of relative positional deviation amount Δ not more than 0.3 μm, where the refractive index n of a total reflection prism member is 1.7.

FIG. 16 shows a relation between the relative positional deviation amount Δ by one total reflection and the incidence angle θ in a case where the refractive index n of the total reflection prism member is 17 and where the center wavelength λc of light is 750 nm. It is seen from FIG. 16 that the range of incidence angle θ may be set to be approximately from 39° to 90°, in order to satisfy Condition (8) while the absolute value of the relative positional deviation amount Δ between the polarization components caused in one total reflection is kept not more than 0.3 µm. The incidence angle θ is about 46° when the relative positional deviation amount Δ is approximately zero.

The aforementioned embodiment described the example in which the exposure apparatus was provided with the single surface position detecting apparatus, but, without having to be limited to this, the detection field can be divided with use of a plurality of surface position detecting apparatus according to need. In this case, calibration among the apparatus can be implemented based on the detection results in a common field between a detection field of a first surface position detecting apparatus and a detection field of a second surface position detecting apparatus.

The aforementioned embodiment was the application of the present invention to the detection of the surface position of the photosensitive substrate in the projection exposure apparatus, but the present invention can also be applied to detection of a surface position of a mask in the projection exposure apparatus. The aforementioned embodiment was the application of the present invention to the detection of the surface position of the photosensitive substrate in the projection exposure apparatus, but the present invention can also be applied to detection of a surface position of an ordinary detection target surface.

The aforementioned embodiment was the application of the present invention to the detection of the surface position (position along a normal to the detection target surface) of the detection target surface. However, without having to be limited to this, the present invention can also be applied, for example, to a measuring apparatus in which an optical member with a total reflection surface is disposed in a measurement optical path and more commonly to an optical apparatus in which an optical member with a total reflection surface is disposed in an optical path. Specifically, the present invention is applicable to an apparatus for measuring a surface shape of a detection target surface as shown in FIG. 17 or to an apparatus for measuring a position of a detection target surface (a two-dimensional position of a detection target surface along in-surface directions) as shown in FIG. 18.

Figure 17:
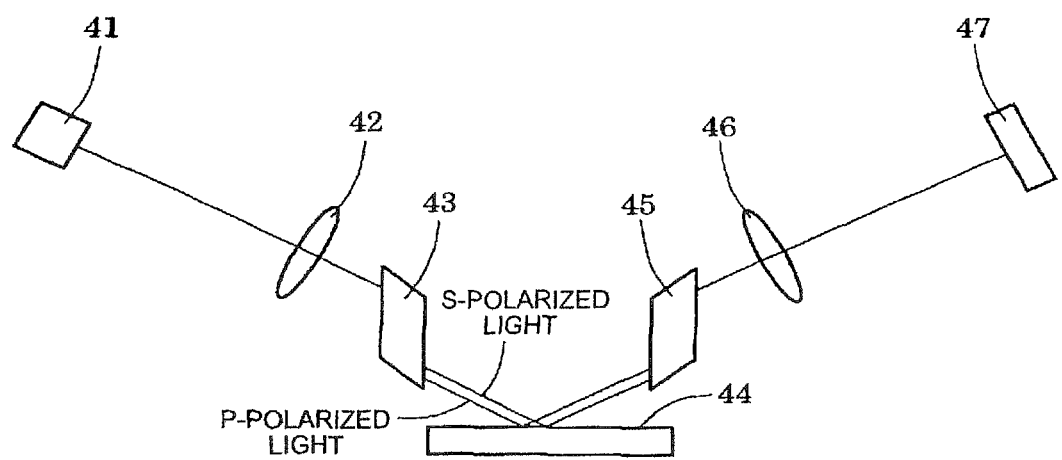
FIG. 17 is a drawing showing an example of application of the present invention to an apparatus for measuring a surface shape of a detection target surface.
Figure 18:
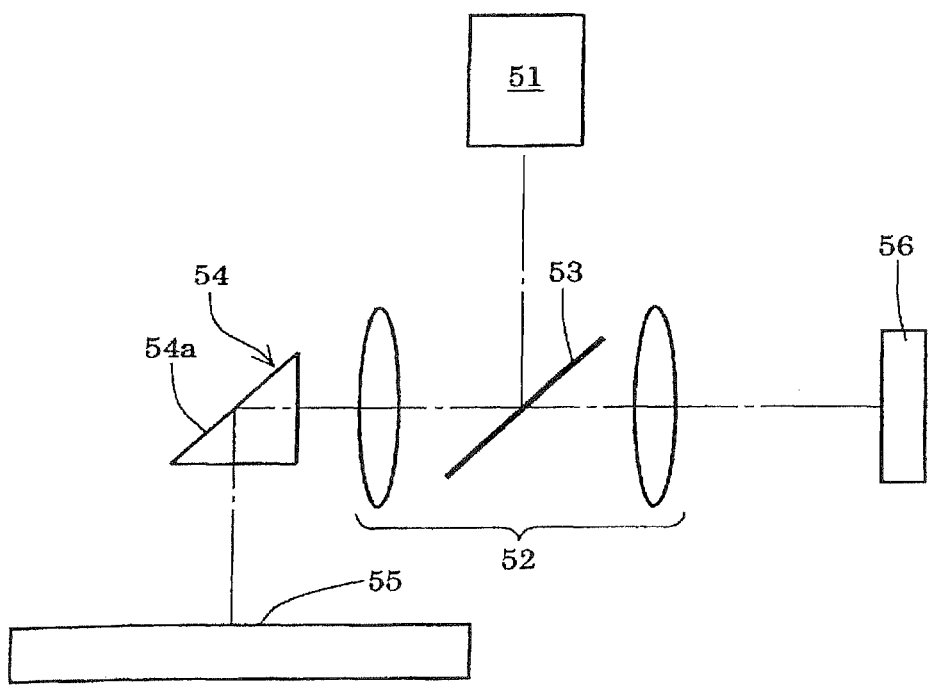
FIG. 18 is a drawing showing an example of application of the present invention to an apparatus for measuring a position of a detection target surface.

In the measuring apparatus shown in FIG. 17, measurement light from a light source 41 travels through a light-sending optical system (projecting optical system) 42 and is incident to a total reflection optical member (optical member with total reflection surfaces) 43, for example, like a rhomboid prism. The measurement light totally reflected on the total reflection surfaces (not shown) of the total reflection optical member 43 is then incident to a detection target surface 44. The measurement light reflected on the detection target surface 44 is then incident to a total reflection optical member 45, for example, having a configuration similar to that of the total reflection optical member 43. The measurement light totally reflected on total reflection surfaces (not shown) of the total reflection optical member 45 travels through a light-receiving optical system 46 and is then incident to an image detector 47, for example, like a CCD.

In this apparatus, the incidence position (image position) of the measurement light to the image detector 47 varies with change in the height position of the detection target surface 44 where the measurement light is incident. Therefore, the surface shape of the detection target surface 44 (distribution of heights at respective in-surface positions) is measured by measuring incidence positions of the measurement light to the image detector 47 while changing the incidence position of the measurement light to the detection target surface 44 by two-dimensional movement of the detection target surface 44 along the in-surface directions, or while changing the incidence position of the measurement light to the detection target surface 44 by action of a vibrating mirror or a polygon mirror in the light-sending optical system 42. The surface shape of the detection target surface 44 cannot be measured with high accuracy when there occurs a relative positional deviation between polarization components in the total reflections in the total reflection optical members 43, 45, e.g., in a case where there is a thin film on the detection target surface 44, or in a case where the detection target surface 44 has polarizing nature.

For measuring the surface shape of the detection target surface 44 with high accuracy while restraining the influence of the relative positional deviation between polarization components caused in the light totally reflected in the total reflection optical members 43, 45, on the measurement of the surface shape of the detection target surface 44, the refractive index n of the total reflection optical members 43, 45 and the incidence angle θ of the incident light to the total reflection surfaces can be determined so that the relative positional deviation amount Δ between the polarization components of the light totally reflected by each total reflection optical member 43, 45 becomes approximately zero, i.e., so that the absolute value of the relative positional deviation amount Δ between the polarization components caused in one total reflection becomes, for example, not more than 0.3 μm and more preferably not more than 0.2 μm.

In the measuring apparatus shown in FIG. 18, measurement light from an illumination system 51 is reflected by a half mirror 53 in an objective optical system 52, and is emitted from the objective optical system 52 to enter a path folding prism (optical member with a total reflection surface) 54. The measurement light totally reflected on a total reflection surface 54a of the path folding prism 54, for example, like a triangular prism illuminates a detection target surface 55. The measurement light reflected by a mark (not shown) provided on the detection target surface 55 is again incident to the path folding prism 54. The measurement light totally reflected on the total reflection surface 54a of the path folding prism 54 then travels through the objective optical system 52 and the half mirror 53 therein to enter an image detector 56, for example, like a CCD.

In the measuring apparatus shown in FIG. 18, positions of marks on the detection target surface 55 and, therefore, positions of the detection target surface 55 (two-dimensional positions of the detection target surface 55 along in-surface directions) are measured based on an output from the image detector 56. The position of the detection target surface 55 cannot be measured with high accuracy when there is a relative positional deviation between polarization components in the total reflection in the path folding prism 54 in a case where the detection target surface 55 has polarizing nature.

For measuring the position of the detection target surface 55 with high accuracy while restraining the influence of the relative positional deviation between polarization components caused in the light totally reflected by the path folding prism 54, on the measurement of the position of the detection target surface 55, the refractive index n of the path folding prism 54 and the incidence angle θ of the incident light to the total reflection surface 54a can be determined so that the relative positional deviation amount Δ between the polarization components of the light totally reflected by the path folding prism 54 becomes approximately zero, i.e., so that the absolute value of the relative positional deviation amount Δ between the polarization components caused in one total reflection becomes, for example, not more than 0.3 μm and more preferably not more than 0.2 μm.

As described above, when a detection target surface has a thin film affecting polarization, or a polarizing property, the Goos-Haenchen Shift will arise at an internal reflection surface (total reflection surface) disposed in an optical path (an illumination optical path, a detection optical path, or the like); therefore, to prevent occurrence thereof, it is preferable to appropriately set the refractive index of the optical member forming the internal reflection surface (total reflection surface) and the angle of incidence to the internal reflection surface (total reflection surface).

Figure 19:
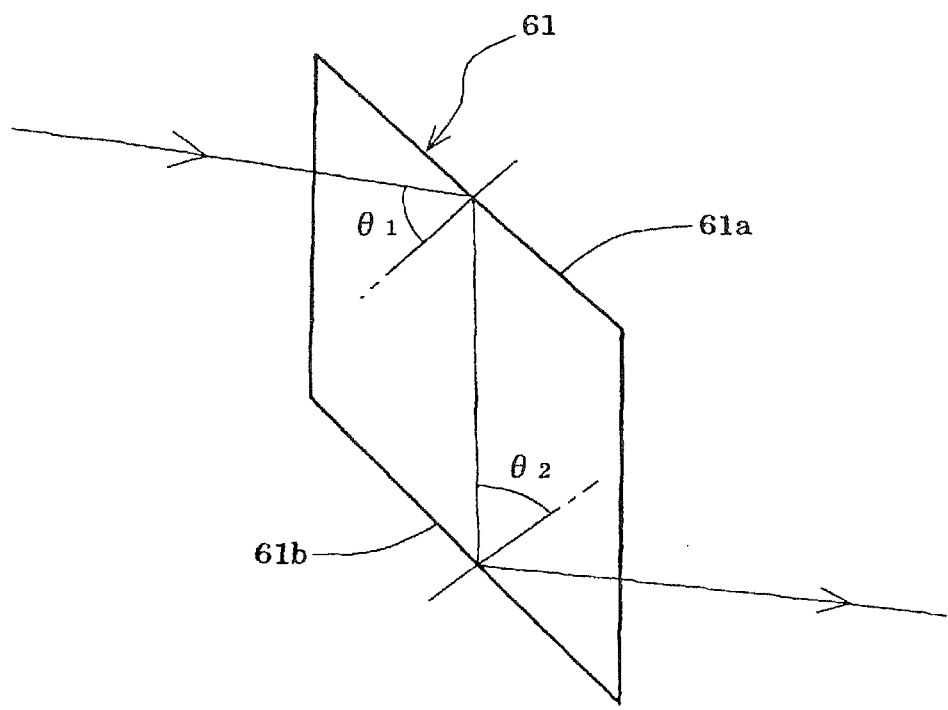
FIG. 19 is a drawing to illustrate an idea to use a tetragonal prism as a total reflection prism member to keep down a relative positional deviation amount finally appearing in light successively totally reflected on two total reflection surfaces.

Incidentally, the aforementioned embodiment shown in FIGS. 1 to 3 uses the parallelogram prisms (rhomboid prisms) each having the two mutually parallel total reflection surfaces, as the total reflection prism members. The refractive index n of the prisms and the angle of incidence θ of the incident light to each total reflection surface are determined so as to keep small the relative positional deviation amount Δ caused at each total reflection surface. However, without having to be limited to this, it is also possible to use, for example, a tetragonal prism 61 having two mutually opposed total reflection surfaces as shown in FIG. 19 (generally, two total reflection surfaces not parallel to each other), as a total reflection prism member, and to determine the refractive index n of the prism and incidence angles $\theta_1$ (0°≤$\theta_1$≤90°) and $\theta_2$ (0°≤$\theta_2$≤90°) of incident light to the two total reflection surfaces so as to keep small a relative positional deviation amount finally caused in the light after successive total reflections on the two total reflection surfaces 61a and 61b, i.e., the sum $\Delta_1+\Delta_2$ of the relative positional deviation amount $\Delta_1$ caused at the first total reflection surface 61a and the relative positional deviation amount $\Delta_2$ caused at the second total reflection surface 61b.

In this case, the relative positional deviation amount finally caused in the light after the successive total reflections on the two total reflection surfaces 61a and 61b, $\Delta_{12}=\Delta_1+\Delta_2$, is represented by Eq (10) below. The first term on the right hand side in Eq (10) corresponds to the relative positional deviation amount $\Delta_1$ caused at the first total reflection surface 61a and the second term on the right hand side corresponds to the relative positional deviation amount $\Delta_2$ caused at the second total reflection surface 61b.

[Math 7]

$$\Delta_{12} = \frac{\lambda \tan\theta_1}{\pi\sqrt{n^2\sin^2\theta_1 - 1}}\left(\frac{1}{n^2\sin^2\theta_1 + \sin^2\theta_1 - 1} - 1\right)\cdot\cos\theta_1 + \frac{\lambda\tan\theta_2}{\pi\sqrt{n^2\sin^2\theta_2 - 1}}\left(\frac{1}{n^2\sin^2\theta_2 + \sin^2\theta_2 - 1} - 1\right)\cdot\cos\theta_2 \qquad (10)$$

In order to restrain the influence of the relative positional deviation between polarization components of the totally reflected light on the detection accuracy or the like, the idea of the aforementioned embodiment to keep the relative positional deviation amount caused at one total reflection surface 0.3 μm or less is applied to the relative positional deviation amount $\Delta_{12}$ represented by Eq (10), and Condition (11) below with the upper limit of 0.3 μm×2=0.6 μm and the lower limit of −0.3 μm×2=−0.6 μm is obtained as a conditional expression for keeping small the relative positional deviation amount $\Delta_{12}$ finally caused in the light after the successive total reflections on the two total reflection surfaces 61a and 61b.

[Math 8]

$$-0.6(\mu m) \leq \frac{\lambda\tan\theta_1}{\pi\sqrt{n^2\sin^2\theta_1 - 1}}\left(\frac{1}{n^2\sin^2\theta_1 + \sin^2\theta_1 - 1} - 1\right)\cdot\cos\theta_1 + \frac{\lambda\tan\theta_2}{\pi\sqrt{n^2\sin^2\theta_2 - 1}}\left(\frac{1}{n^2\sin^2\theta_2 + \sin^2\theta_2 - 1} - 1\right)\cdot\cos\theta_2 \leq 0.6(\mu m) \quad (11)$$

In a specific numerical example, where the tetragonal prism 61 is made of silica glass with the refractive index n=1.45, where the incidence angle $\theta_1$ to the first total reflection surface 61a is 47°, and where the incidence angle $\theta_2$ to the second total reflection surface 61b is 70°, the relative positional deviation amount $\Delta_1$ caused at the first total reflection surface 61a is +0.48 μm and the relative positional deviation amount $\Delta_2$ caused at the second total reflection surface 61b is −0.21 μm. Namely, the relative positional deviation amount $\Delta_1$ caused at the first total reflection surface 61a and the relative positional deviation amount $\Delta_2$ caused at the second total reflection surface 61b cancel each other and the relative positional deviation amount $\Delta_{12}$ finally caused in the light after the successive total reflections on the two total reflection surfaces 61a and 61b becomes +0.27 μm, which is not more than 0.3 μm.

In another numerical example, where the tetragonal prism 61 is made of silica glass with the refractive index n=1.45, where the incidence angle $\theta_1$ to the first total reflection surface 61a is 50°, and where the incidence angle $\theta_2$ to the second total reflection surface 61b is 60°, the relative positional deviation amount $\Delta_1$ caused at the first total reflection surface 61a is +0.155 μm and the relative positional deviation amount $\Delta_2$ caused at the second total reflection surface 61b is −0.136 μm. Namely, the relative positional deviation amount $\Delta_1$ caused at the first total reflection surface 61a and the relative positional deviation amount $\Delta_2$ caused at the second total reflection surface 61b cancel each other and the relative positional deviation amount $\Delta_{12}$ finally caused in the light after the successive total reflections on the two total reflection surfaces 61a and 61b becomes +0.019 μm, which is not more than 0.05 μm.

In the description with reference to FIG. 19, the tetragonal prism 61 with the two total reflection surfaces was used as a total reflection prism member, and the same idea can also be generally applied to cases using a polygonal prism having two or more total reflection surfaces. Namely, the refractive index n of the prism and the incidence angle $\theta a$ (0°≤$\theta a$≤90°; a=1–N) of incident light to the a-th total reflection surface (internal reflection surface) may be determined so as to keep small the relative positional deviation amount finally caused in light after successive total reflections on a plurality of total reflection surfaces (N total reflection surfaces: N is an integer of 2 or more) in one polygonal prism (generally, an optical member). In this case, the relative positional deviation amount $\Delta_{1N}$ finally caused in the light after the successive total reflections on the N total reflection surfaces is represented by Eq (12) below.

[Math 9]

$$\Delta_{1N} = \sum_{a=1}^{N}\frac{\lambda\tan\theta_a}{\pi\sqrt{n^2\sin^2\theta_a - 1}}\left(\frac{1}{n^2\sin^2\theta_a + \sin^2\theta_a - 1} - 1\right)\cdot\cos\theta_a \quad (12)$$

In order to restrain the influence of the relative positional deviation between polarization components of totally reflected light on the detection accuracy or the like, the idea of the aforementioned embodiment to keep the relative positional deviation amount caused at one total reflection surface 0.3 μm or less is applied to the relative positional deviation amount $\Delta_{1N}$ represented by Eq (12), and Condition (13) below with the upper limit of 0.3 μm×N=0.3N μm and the lower limit of −0.3 μm×N=−0.3N μm is obtained as a conditional expression for keeping small the relative positional deviation amount $\Delta_{1N}$ finally caused in the light after the successive total reflections on the N total reflection surfaces.

[Math 10]

$$-0.3N(\mu m) \leq \sum_{a=1}^{N}\frac{\lambda\tan\theta_a}{\pi\sqrt{n^2\sin^2\theta_a - 1}}\left(\frac{1}{n^2\sin^2\theta_a + \sin^2\theta_a - 1} - 1\right)\cdot\cos\theta_a \leq 0.3N(\mu m) \quad (13)$$

Furthermore, without having to be limited to one optical member, the present invention can also be applied to a plurality of optical members in such a manner that the refractive index na of an optical member forming the a-th total reflection surface (internal reflection surface) and the incidence angle θa (0°≤θa≤90°; a=1–N) of incident light to the a-th total reflection surface may be determined so as to keep small the relative positional deviation amount finally caused in the light after successive total reflections on a plurality of total reflection surfaces (N total reflection surfaces: N is an integer of 2 or more). In this case, the relative positional deviation amount $\Delta_{1N}$ finally caused in the light after the successive total reflections on the N total reflection surfaces in the plurality of optical members is represented by Eq (14) below.

[Math 11]

$$\Delta_{1N} = \sum_{a=1}^{N}\frac{\lambda\tan\theta_a}{\pi\sqrt{n_a^2\sin^2\theta_a - 1}}\left(\frac{1}{n_a^2\sin^2\theta_a + \sin^2\theta_a - 1} - 1\right)\cdot\cos\theta_a \quad (14)$$

In order to restrain the influence of the relative positional deviation between polarization components of totally reflected light on the detection accuracy or the like, the idea of the aforementioned embodiment to keep the relative positional deviation amount at one total reflection surface 0.3 μm or less is applied to the relative positional deviation amount $\Delta_{1N}$ represented by Eq (14), and Condition (15) below with the upper limit of 0.3 μm×N=0.3N μm and the lower limit of −0.3 μm×N=−0.3N μm is obtained as a conditional expression for keeping small the relative positional deviation amount $\Delta_{1N}$ finally caused in the light after the successive total reflections on the N total reflection surfaces.

[Math 12]

$$-0.3N(\mu m) \leq \sum_{a=1}^{N} \frac{\lambda \tan\theta_a}{\pi\sqrt{n_a^2\sin^2\theta_a - 1}}\left(\frac{1}{n^2\sin^2\theta_a + \sin^2\theta_a - 1} - 1\right) \cdot \cos\theta_a \leq 0.3N(\mu m) \quad (15)$$

There is no lower limit set in the aforementioned Conditions (8) and (9), but it is preferable to set the lower limit of Condition (8) to "−0.3 μm or more" and to set the lower limit of Condition (9) to "−0.2 μm or more." When the relative positional deviation amount is smaller than the lower limit of Condition (8), it will unfavorably result in bringing the following disadvantages: the apparatus comes to have a configuration of oblique incidence with a large incidence angle; the optical members such as prisms become complicated and large in scale; the entire apparatus also becomes complicated and large in scale. On the other hand, when the relative positional deviation amount is smaller than the lower limit of Condition (9), it will unfavorably result in enhancing the tendency of increasing the incidence angle in the configuration of oblique incidence, enhancing the tendency of making the optical members such as prisms complicated and larger in scale, and further enhancing the tendency of making the entire apparatus complicated and larger in scale.

The upper limit of Condition (8) is set to "+0.3 μm or less," but it is preferable to set the upper limit of Condition (8) to "+0.05 μm or less" and to set the lower limit of Condition (8) to "−0.05 μm or more," in order to enable higher-accuracy and stabler detection while enabling simplification and compactification of the optical members and apparatus. Namely, Condition (16) below is preferably satisfied in order to enable higher-accuracy and stabler detection while enabling simplification and compactification of the optical members and apparatus.

[Math 13]

$$-0.05(\mu m) \leq \frac{\lambda \tan\theta}{\pi\sqrt{n^2\sin^2\theta - 1}}\left(\frac{1}{n^2\sin^2\theta + \sin^2\theta - 1} - 1\right) \cdot \cos\theta \leq 0.05(\mu m) \quad (16)$$

Figure 20:
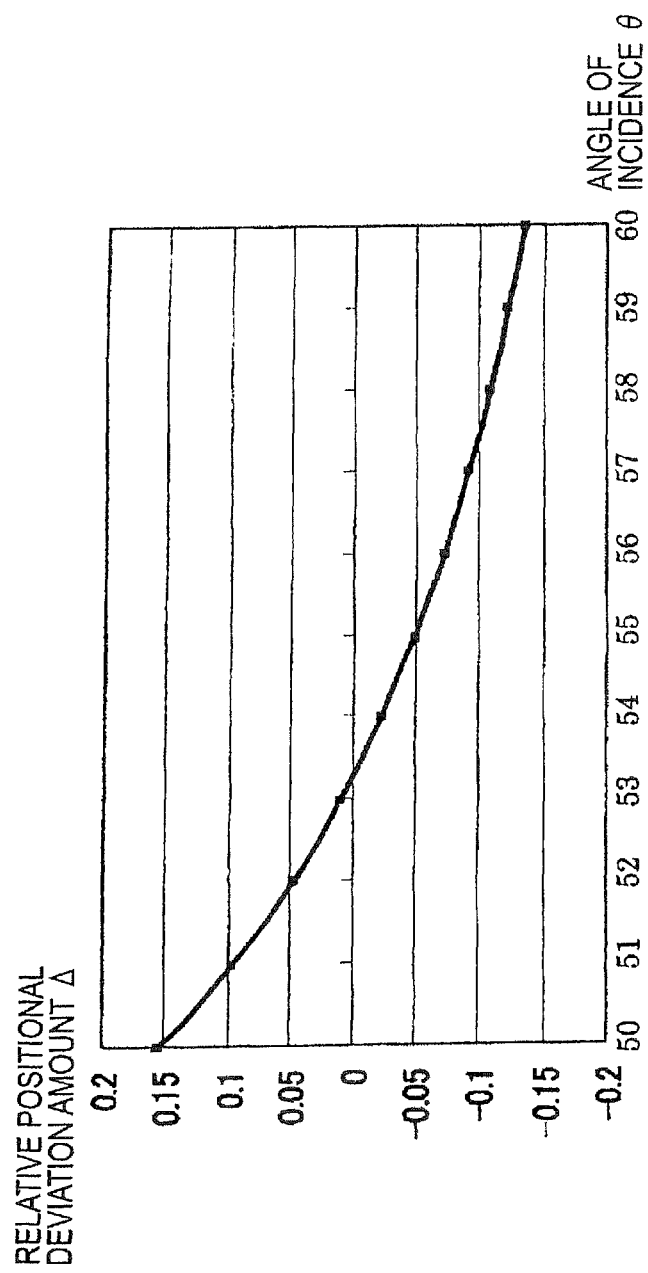
FIG. 20 is a partly enlarged view of FIG. 13 and drawing to illustrate a range of incidence angle θ to keep the absolute value of relative positional deviation amount Δ not more than 0.05 μm.

The below will describe a range of incidence angle θ where the absolute value of the relative positional deviation amount Δ between the polarization components caused in one total reflection becomes not more than 0.05 μm, with change in the refractive index n of the total reflection prism member, with reference to FIGS. 20 to 23 corresponding to FIGS. 13 to 16. FIG. 20 is a drawing showing a partly enlarged view of FIG. 13, and shows the relation between the relative positional deviation amount Δ in one total reflection and the incidence angle θ in the case where the refractive index n of the total reflection prism member is 1.45 and where the center wavelength λc of light is 750 nm. It is seen from FIG. 20 that the range of incidence angle θ can be set to be approximately from 52° to 55°, in order to satisfy Condition (16) while the absolute value of the relative positional deviation amount Δ between the polarization components caused in one total reflection is kept not more than 0.05 μm.

Figure 21:
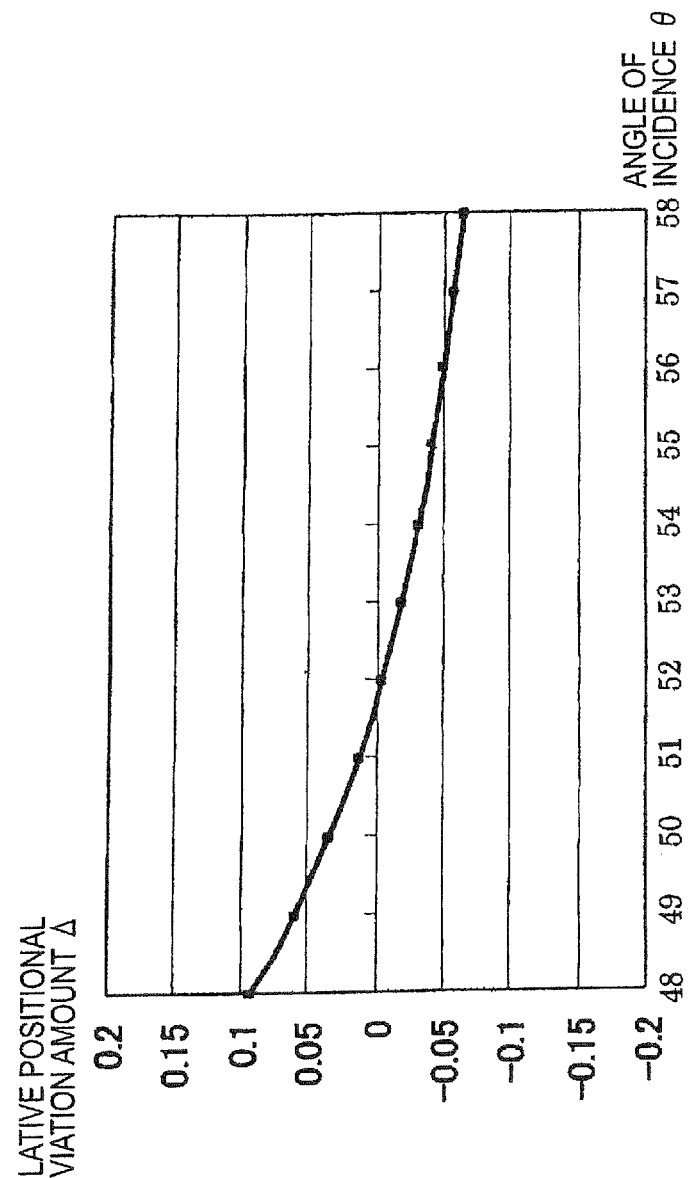
FIG. 21 is a partly enlarged view of FIG. 14 and drawing to illustrate a range of incidence angle θ to keep the absolute value of relative positional deviation amount Δ not more than 0.05 μm.

FIG. 21 is a drawing showing a partly enlarged view of FIG. 14, and shows the relation between the relative positional deviation amount Δ in one total reflection and the incidence angle θ in the case where the refractive index n of the total reflection prism member is 1.5 and where the center wavelength λc of light is 750 nm. It is seen from FIG. 21 that the range of incidence angle θ can be set to be approximately from 24.5° to 56°, in order to satisfy Condition (16) while the absolute value of the relative positional deviation amount Δ between the polarization components caused in one total reflection is kept not more than 0.05 μm.

Figure 22:
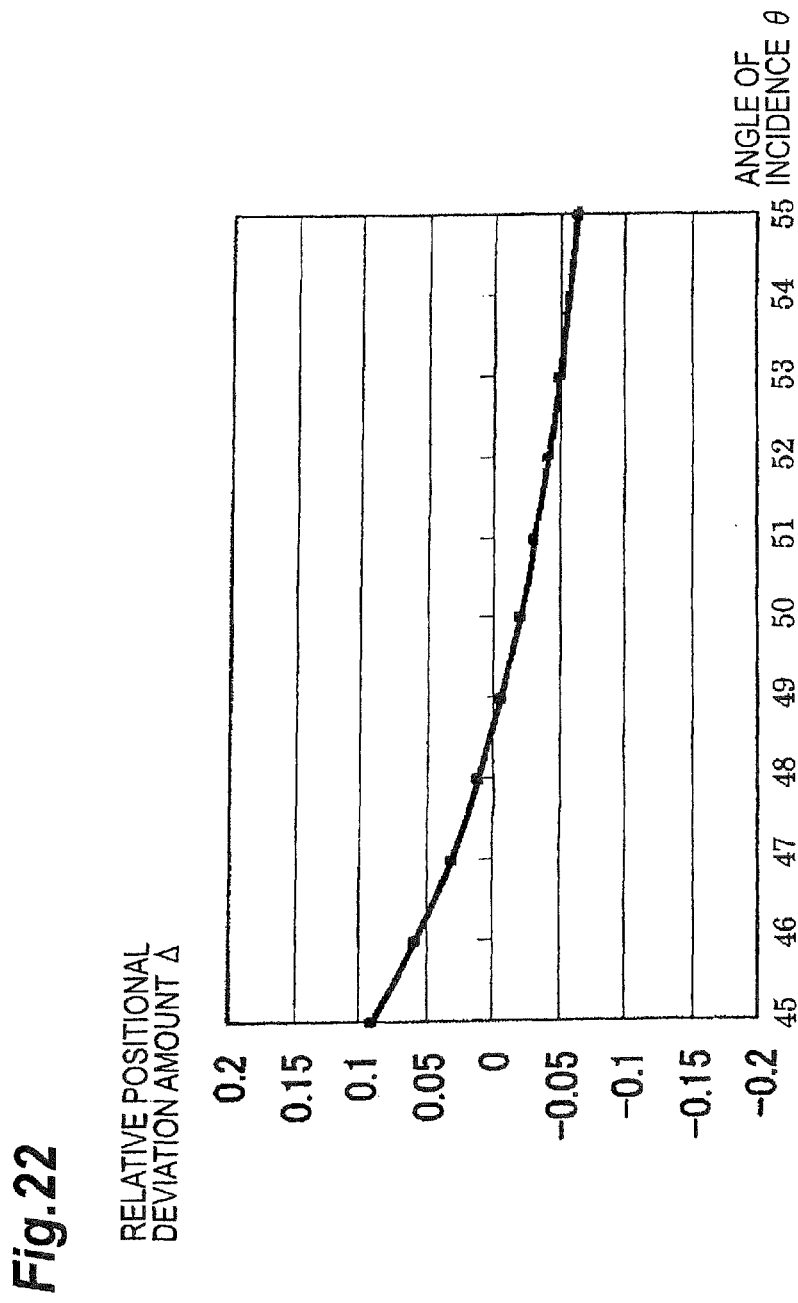
FIG. 22 is a partly enlarged view of FIG. 15 and drawing to illustrate a range of incidence angle θ to keep the absolute value of relative positional deviation amount Δ not more than 0.05 μm.

FIG. 22 is a drawing showing a partly enlarged view of FIG. 15, and shows the relation between the relative positional deviation amount Δ in one total reflection and the incidence angle θ in the case where the refractive index n of the total reflection prism member is 1.6 and where the center wavelength λc of light is 750 nm. It is seen from FIG. 22 that the range of incidence angle θ can be set to be approximately from 46.5° to 53°, in order to satisfy Condition (16) while the absolute value of the relative positional deviation amount Δ between the polarization components caused in one total reflection is kept not more than 0.05 μm.

Figure 23:
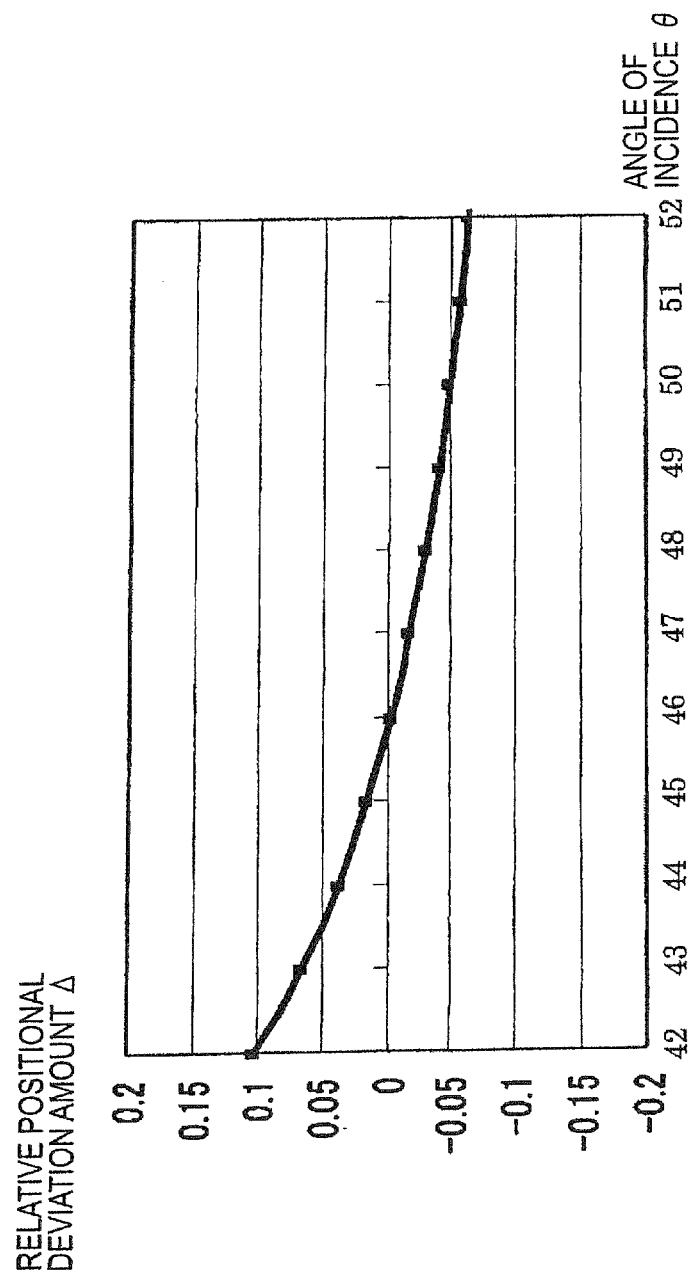
FIG. 23 is a partly enlarged view of FIG. 16 and drawing to illustrate a range of incidence angle θ to keep the absolute value of relative positional deviation amount Δ not more than 0.05 μm.

FIG. 23 is a drawing showing a partly enlarged view of FIG. 16, and shows the relation between the relative positional deviation amount Δ in one total reflection and the incidence angle θ in the case where the refractive index n of the total reflection prism member is 1.7 and where the center wavelength λc of light is 750 nm. It is seen from FIG. 23 that the range of incidence angle θ can be set to be approximately from 43.5° to 50°, in order to satisfy Condition (16) while the absolute value of the relative positional deviation amount Δ between the polarization components caused in one total reflection is kept not more than 0.05 μm.

Similarly, in the case where light is successively totally reflected on a plurality of total reflection surfaces in one optical member, the upper limit of Condition (13) can be set to 0.05 μm×N=0.05N μm and the lower limit thereof to −0.05 μm×N=−0.05N μm, whereby Condition (17), which is more preferable than Condition (13), is obtained as a conditional expression for enabling higher-accuracy and stabler detection while enabling simplification and compactification of the optical members and apparatus.

[Math 14]

$$-0.05N(\mu m) \leq \sum_{a=1}^{N} \frac{\lambda \tan\theta_a}{\pi\sqrt{n^2\sin^2\theta_a - 1}}\left(\frac{1}{n^2\sin^2\theta_a + \sin^2\theta_a - 1} - 1\right) \cdot \cos\theta_a \leq 0.05N(\mu m) \quad (17)$$

Similarly, in the case where light is successively totally reflected on a plurality of total reflection surfaces in a plurality of optical members, the upper limit of Condition (15) can be set to 0.05 μm×N=0.05N μm and the lower limit thereof to −0.05 μm×N=−0.05N μm, whereby Condition (18), which is more preferable than Condition (15), is obtained as a conditional expression for enabling higher-accuracy and stabler detection while enabling simplification and compactification of the optical members and apparatus.

[Math 15]

$$-0.05N(\mu m) \leq \sum_{a=1}^{N} \frac{\lambda \tan\theta_a}{\pi\sqrt{n_a^2\sin^2\theta_a - 1}} \left( \frac{1}{n_a^2\sin^2\theta_a + \sin^2\theta_a - 1} - 1 \right) \cdot \cos\theta_a \leq 0.05N(\mu m) \quad (18)$$

In the present invention the GHS caused at a plurality of total reflection surfaces is controlled by properly setting the incidence angle and the refractive index forming each total reflection surface, but it is also possible to control the Goos-Haenchen Shift (GHS) amount, by making the incidence angle of at least one optical member with a total reflection surface (one or more of optical members having a total reflection surface) adjustable by an adjusting device and changing the incidence angle to each total reflection surface to adjust the Goos-Haenchen Shift (GHS) amount. In this case, the adjusting device can be arranged so as to be able to manually or automatically adjust the optical member, but it is preferable to configure the adjusting device so as to be able to automatically adjust the optical member. In this case, a preferred configuration is such that a detecting device detects light having passed via each total reflection surface and the adjusting device including a motor and others is driven so as to automatically set an appropriate Goos-Haenchen Shift (GHS) amount, based on output information (a detection signal, a drive signal, or the like) from the detecting device.

For example, in the embodied form shown in FIG. 12, a light splitting member (half mirror or the like) is located on the detector side of the lens 10 (above the lens 10) and a detecting device (detector or the like) for detecting the Goos-Haenchen Shift (GHS) amount is disposed in an optical path split by the beam splitting member. Driving devices (adjusting devices) are arranged to independently incline the respective path folding prisms (31, 32), based on the output from the detecting device (detector or the like), and the angles of incidence of light to the respective total reflection surfaces (31b, 32b) of the respective path folding prisms (31, 32), are adjusted independently of each other through the driving devices (adjusting devices), whereby the GHS amount of the entire apparatus can be properly set.

The exposure apparatus of the above-described embodiment can manufacture micro devices (semiconductor devices, imaging devices, liquid-crystal display devices, thin-film magnetic heads, etc.) through a process of illuminating a reticle (mask) by the illumination apparatus (illumination step) and exposing a photosensitive substrate with a transfer pattern formed in a mask, by the projection optical system (exposure step). The below will describe an example of a method for obtaining semiconductor devices as micro devices by forming a predetermined circuit pattern in a wafer or the like as a photosensitive substrate by means of the exposure apparatus of the embodiment, with reference to the flowchart of FIG. 24.

Figure 24:
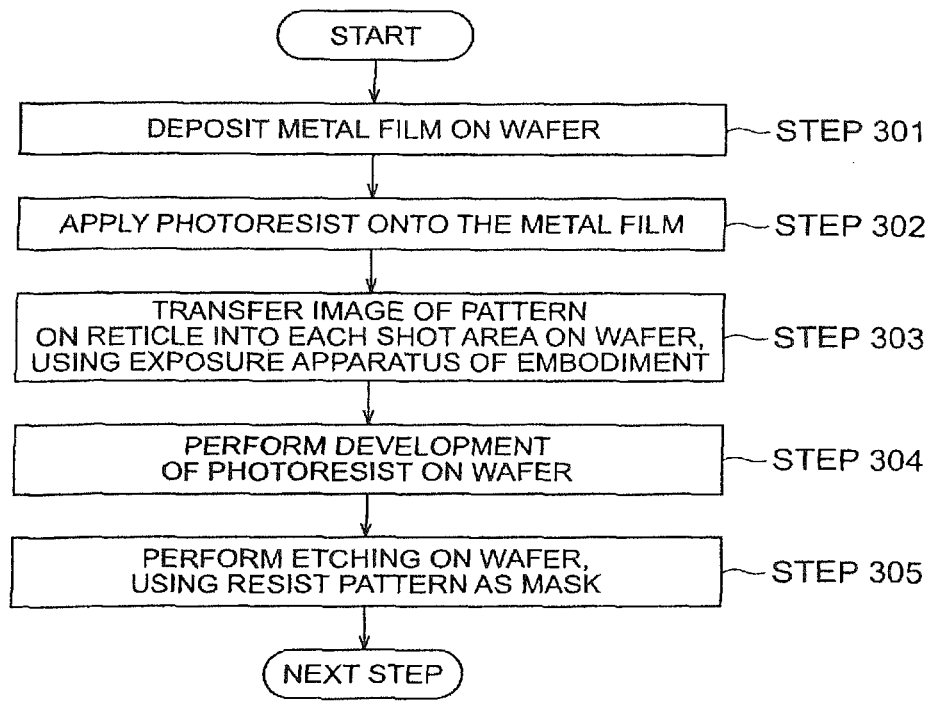
FIG. 24 is a flowchart of a method for obtaining semiconductor devices as micro devices.

The first step 301 in FIG. 24 is to deposit a metal film on each wafer in one lot. The next step 302 is to apply a photoresist onto the metal film on each wafer in the lot. The subsequent step 303 is to use the exposure apparatus of the above embodiment to sequentially transfer an image of a pattern on a mask into each shot area on each wafer in the lot through the projection optical system of the exposure apparatus. The subsequent step 304 is to perform development of the photoresist on each wafer in the lot and the next step 305 is to perform etching using the resist pattern on each wafer in the lot as a mask, and thereby to form a circuit pattern corresponding to the pattern on the mask, in each shot area on each wafer.

Thereafter, devices such as semiconductor devices are manufactured through steps including formation of circuit patterns in upper layers. The above-described semiconductor device manufacturing method permits us to obtain the semiconductor devices with extremely fine circuit patterns at high throughput. The steps 301-305 are arranged to perform the respective steps of deposition of metal on the wafer, application of the resist onto the metal film, exposure, development, and etching, but it is needless to mention that the process may be modified as follows: prior to these steps, an oxide film of silicon is formed on the wafer, a resist is then applied onto the silicon oxide film, and thereafter the steps of exposure, development, and etching are carried out.

Figure 25:
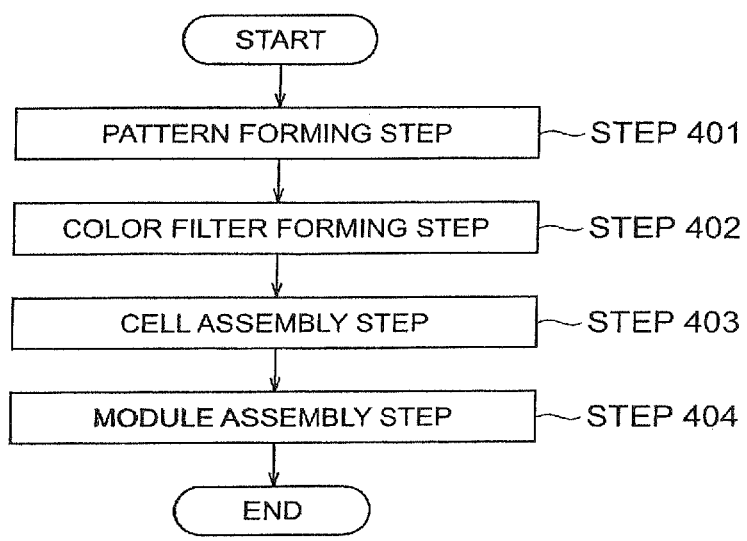
FIG. 25 is a flowchart of a method for obtaining a liquid-crystal display device as a micro device.

The exposure apparatus of the embodiment can also manufacture a liquid-crystal display device as a micro device by forming predetermined patterns (circuit pattern, electrode pattern, etc.) on plates (glass substrates). An example of a method in this case will be described below with reference to the flowchart of FIG. 25. In FIG. 25, a pattern forming step 401 is to execute a so-called photolithography step of transferring a pattern of a mask onto a photosensitive substrate (a glass substrate coated with a resist or the like) by means of the exposure apparatus of the above embodiment. This photolithography step results in forming a predetermined pattern including a large number of electrodes and others on the photosensitive substrate. Thereafter, the exposed substrate is processed through each of steps including a development step, an etching step, a resist removing step, etc. whereby the predetermined pattern is formed on the substrate, followed by the next color filter forming step 402.

The next color filter forming step 402 is to form a color filter in which a large number of sets of three dots corresponding to R (Red), G (Green), and B (Blue) are arrayed in a matrix pattern or in which sets of filters of three stripes of R, G, and B are arrayed in the horizontal scan line direction. After the color filter forming step 402, a cell assembling step 403 is executed. The cell assembling step 403 is to assemble a liquid crystal panel (liquid crystal cell) using the substrate with the predetermined pattern obtained in the pattern forming step 401, the color filter obtained in the color filter forming step 402, and others.

In the cell assembling step 403, the liquid crystal panel (liquid crystal cell) is manufactured, for example, by pouring a liquid crystal into between the substrate with the predetermined pattern obtained in the pattern forming step 401 and the color filter obtained in the color filter forming step 402. The subsequent module assembling step 404 is to attach various components such as electric circuits and backlights for display operation of the assembled liquid crystal panel (liquid crystal cell) to complete the liquid-crystal display device. The above-described manufacturing method of the liquid-crystal display device permits us to obtain the liquid-crystal display device with extremely fine circuit patterns at high throughput.

The invention claimed is:

1. A position detecting apparatus which detects a position of a target surface in a direction crossing the target surface with a light beam which is projected onto the target surface from an oblique direction with respect to the target surface and is reflected on the target surface, the surface position detecting apparatus comprising;

a prism member arranged in an optical path of the light beam, the prism member having a first reflection surface and a second reflection surface, the first reflection surface performing a total reflection of the light beam within the prism member, the second reflection surface performing a total reflection of the light beam from the first reflection surface within the prism member, the first and second reflection surfaces being arranged so that the light beam from the second reflection surface and the light beam on an incidence side of the first reflection surface are non-crossing each other, wherein one of incidence angles of the light beam to the first and second reflection surfaces is smaller than the other of the incidence angles so that, with respect to a relative positional deviation caused by total reflection between a first polarization component and a second polarization component which have orthogonal polarization directions relative to each other and constitute the light beam, at least a part of a first relative positional deviation amount caused at the first reflection surface and a second relative positional deviation amount caused at the second reflection surface substantially cancel each other.

2. The position detecting apparatus according to claim 1, wherein the prism member comprises a first prism having the first reflection surface and a second prism having the second reflection surface.

3. The position detecting apparatus according to claim 2, wherein a refractive index of the first prism and a refractive index of the second prism are different from each other.

4. The position detecting apparatus according to claim 2, wherein the first prism is arranged in the optical path of the light beam such that the light beam arriving from the first prism is projected onto the target surface, and the second prism is arranged in the optical path of the light beam such that the second reflection surface reflects the light beam arriving from the target surface.

5. The position detecting apparatus according to claim 1, wherein the one of the incidence angles is between 47° and 50°, the other of the incidence angles is between 70° and 60°.

6. The position detecting apparatus according to claim 1, wherein the first and second reflection surfaces are arranged in the optical path of the light beam such that the light beam arriving from the second reflection surface is projected onto the target surface or such that the first reflection surface reflects the light beam arriving from the target surface.

7. An exposure apparatus which exposes a photosensitive substrate with light from a pattern of a mask through a projection optical system, the exposure apparatus comprising:
a position detecting apparatus according to claim 1, which detects at least one of positions of a pattern surface of the mask and a surface to be exposed on the photosensitive substrate with respect to a direction of an optical axis of the projection optical system; and
a controlling system which controls at least one of positions of the pattern surface and the surface to be exposed relative to the projection optical system on the basis of a detection result of the position detecting apparatus.

8. A method of manufacturing a device comprising;
transferring the pattern on the photosensitive substrate, by using the exposure apparatus according to claim 7; and
developing the photosensitive substrate on which the pattern is transferred.

9. A method of exposing a photosensitive substrate with light from a pattern of a mask through a projection optical system, the method comprising:
detecting at least one of positions of a pattern surface of the mask and a surface to be exposed on the photosensitive substrate with respect to a direction of an optical axis of the projection optical system by using the position detecting apparatus according to claim 1; and
controlling at least one of the positions of the pattern surface of the mask and the surface to be exposed of the photosensitive substrate with respect to the projection optical system on the basis of a detection result of the position detecting apparatus.

10. A method of manufacturing a device comprising:
transferring the pattern on the photosensitive substrate, by using the method according to claim 9; and
developing the photosensitive substrate on which the pattern is transferred.

11. A position detecting apparatus which detects a position of a target surface in a direction crossing the target surface with a light beam which is projected onto the target surface from an oblique direction with respect to the target surface and is reflected on the target surface, the surface position detecting apparatus comprising;
a prism member arranged in an optical path of the light beam, the prism member having a first reflection surface and a second reflection surface, the first reflection surface performing a total reflection of the light beam within the prism member, the second reflection surface performing a total reflection of the light beam from the first reflection surface within the prism member, the first and second reflection surfaces being arranged so that the light beam from the second reflection surface and the light beam on an incidence side of the first reflection surface are non-crossing each other,
wherein an incidence angle of the light beam to one of the first and second reflection surfaces is smaller than an incidence angle of the light beam to the other of the first and second reflection surfaces so that, with respect to positional deviations caused by total reflection to a first polarization component and a second polarization component which have orthogonal polarization directions relative to each other and constitute the light beam, a first difference between a positional deviation amount of the first polarization component and a positional deviation amount of the second polarization component at the one of the first and second reflection surfaces is a positive value, and a second difference between a positional deviation amount of the first polarization component and a positional deviation amount of the second polarization component at the other of the first and second reflection surfaces is a negative value.

12. The position detecting apparatus according to claim 11, wherein the prism member comprises a first prism having the first reflection surface and a second prism having the second reflection surface.

13. The position detecting apparatus according to claim 12, wherein a refractive index of the first prism and a refractive index of the second prism are different from each other.

14. The position detecting apparatus according to claim 12, wherein the first prism is arranged in the optical path of the light beam such that the light beam arriving from the first prism is projected onto the target surface, and the second prism is arranged in the optical path of the light beam such that the second reflection surface reflects the light beam arriving from the target surface.

15. The position detecting apparatus according to claim 11, wherein the one of the incidence angles is between 47° and 50°, the other of the incidence angles is between 70° and 60°.

16. The position detecting apparatus according to claim 11, wherein the first and second reflection surfaces are arranged in the optical path of the light beam such that the light beam arriving from the second reflection surface is projected onto the target surface or such that the first reflection surface reflects the light beam arriving from the target surface.

17. An exposure apparatus which exposes a photosensitive substrate with light from a pattern of a mask through a projection optical system, the exposure apparatus comprising:
- a position detecting apparatus according to claim 11, which detects at least one of positions of a pattern surface of the mask and a surface to be exposed on the photosensitive substrate with respect to a direction of an optical axis of the projection optical system; and
- a controlling system which controls at least one of positions of the pattern surface and the surface to be exposed relative to the projection optical system on the basis of a detection result of the position detecting apparatus.

18. A method of exposing a photosensitive substrate with light from a pattern of a mask through a projection optical system, the method comprising:
- detecting at least one of positions of a pattern surface of the mask and a surface to be exposed on the photosensitive substrate with respect to a direction of an optical axis of the projection optical system by using the position detecting apparatus according to claim 11; and
- controlling at least one of the positions of the pattern surface of the mask and the surface to be exposed of the photosensitive substrate with respect to the projection optical system on the basis of a detection result of the position detecting apparatus.

19. A method of manufacturing a device comprising;
- transferring the pattern on the photosensitive substrate, by using the exposure apparatus according to claim 17; and
- developing the photosensitive substrate on which the pattern is transferred.

20. A method of manufacturing a device comprising:
- transferring the pattern on the photosensitive substrate, by using the method according to claim 18; and
- developing the photosensitive substrate on which the pattern is transferred.

* * * * *